US012324151B2

(12) United States Patent
Lee

(10) Patent No.: US 12,324,151 B2
(45) Date of Patent: Jun. 3, 2025

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 476 days.

(21) Appl. No.: 17/329,924

(22) Filed: May 25, 2021

(65) Prior Publication Data

US 2022/0157839 A1 May 19, 2022

(30) Foreign Application Priority Data

Nov. 18, 2020 (KR) .................. 10-2020-0154975

(51) Int. Cl.
| | | |
|---|---|---|
| H10B 41/40 | (2023.01) | |
| H10B 41/10 | (2023.01) | |
| H10B 41/27 | (2023.01) | |
| H10B 43/10 | (2023.01) | |
| H10B 43/27 | (2023.01) | |
| H10B 43/40 | (2023.01) | |

(52) U.S. Cl.
CPC ............. *H10B 41/40* (2023.02); *H10B 41/10* (2023.02); *H10B 41/27* (2023.02); *H10B 43/10* (2023.02); *H10B 43/27* (2023.02); *H10B 43/40* (2023.02)

(58) Field of Classification Search
CPC ........ H10B 43/00–50; H10B 41/00–70; H01L 21/768–76898; H01L 23/522–53295; H01L 2221/10–1094
See application file for complete search history.

(56) References Cited

U.S. PATENT DOCUMENTS

| | | | | |
|---|---|---|---|---|
| 5,444,022 | A | * | 8/1995 | Gardner ............ H01L 21/76838 257/E21.59 |
| 2019/0385935 | A1 | | 12/2019 | Gao et al. |
| 2020/0105735 | A1 | * | 4/2020 | Park ....................... H10B 41/27 |
| 2020/0251374 | A1 | * | 8/2020 | Makala ............. H01L 21/68742 |
| 2021/0013303 | A1 | * | 1/2021 | Chen ....................... H01L 23/585 |
| 2021/0134748 | A1 | * | 5/2021 | Liu .......................... H01L 25/50 |
| 2021/0217716 | A1 | * | 7/2021 | Wu ......................... H10B 41/40 |
| 2021/0296284 | A1 | * | 9/2021 | Sharangpani ........... H01L 24/80 |
| 2021/0320075 | A1 | * | 10/2021 | Hou ........................ H01L 24/05 |

FOREIGN PATENT DOCUMENTS

KR 1020200052497 A 5/2020

* cited by examiner

*Primary Examiner* — Eric A. Ward
*Assistant Examiner* — Nora T. Nix
(74) *Attorney, Agent, or Firm* — WILLIAM PARK & ASSOCIATES LTD.

(57) ABSTRACT

Provided are a semiconductor memory device and manufacturing of the semiconductor memory device. The semiconductor memory device includes a first circuit structure, a first conductive line connected to the first circuit structure, a second conductive line facing the first conductive line, and a second circuit structure overlapping with the first circuit structure with the first and second conductive lines interposed therebetween, the second circuit structure being connected to the second conductive line. One of the first conductive line and the second conductive line has a region protruding toward the other of the first conductive line and the second conductive line.

13 Claims, 31 Drawing Sheets

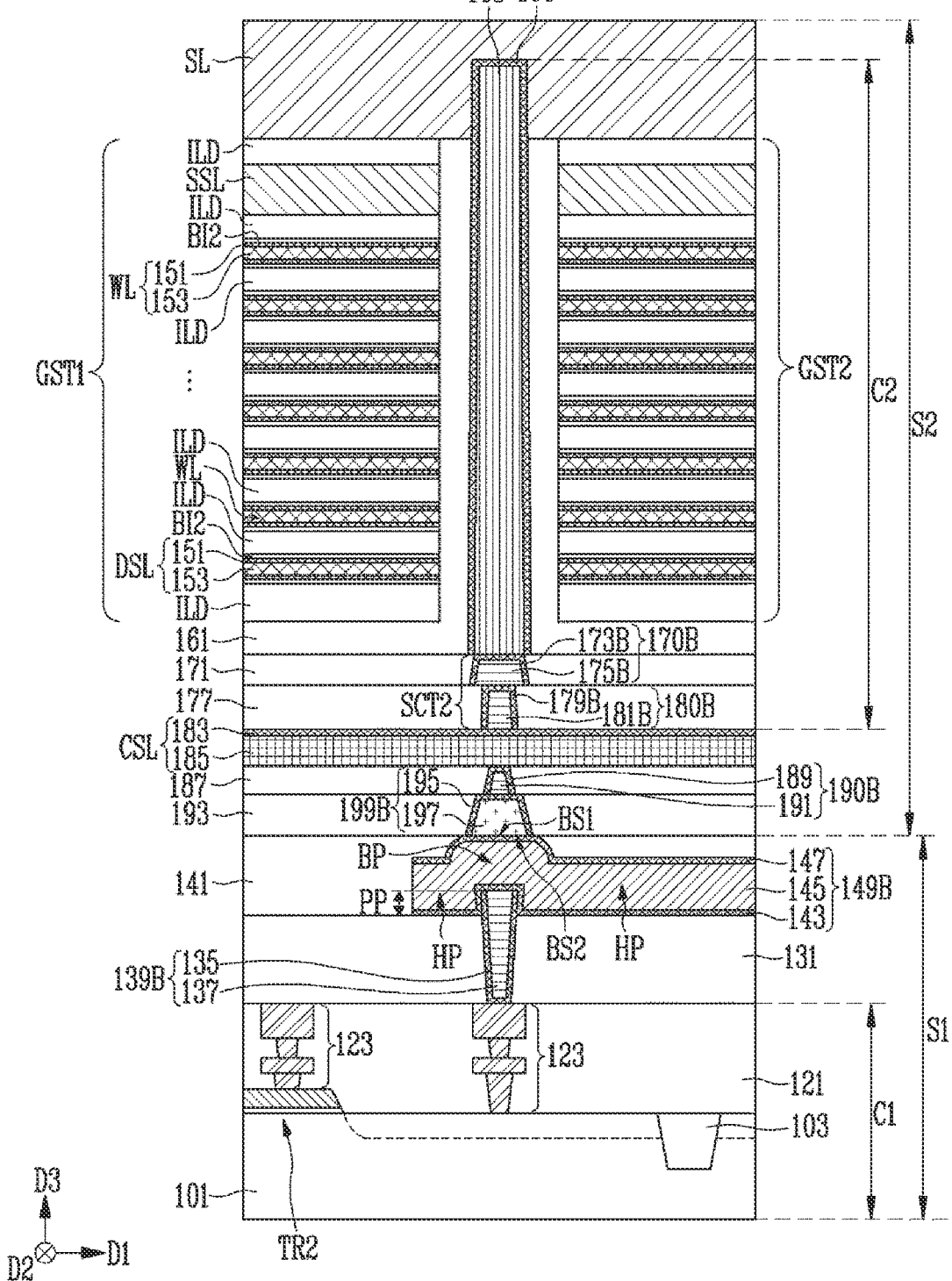

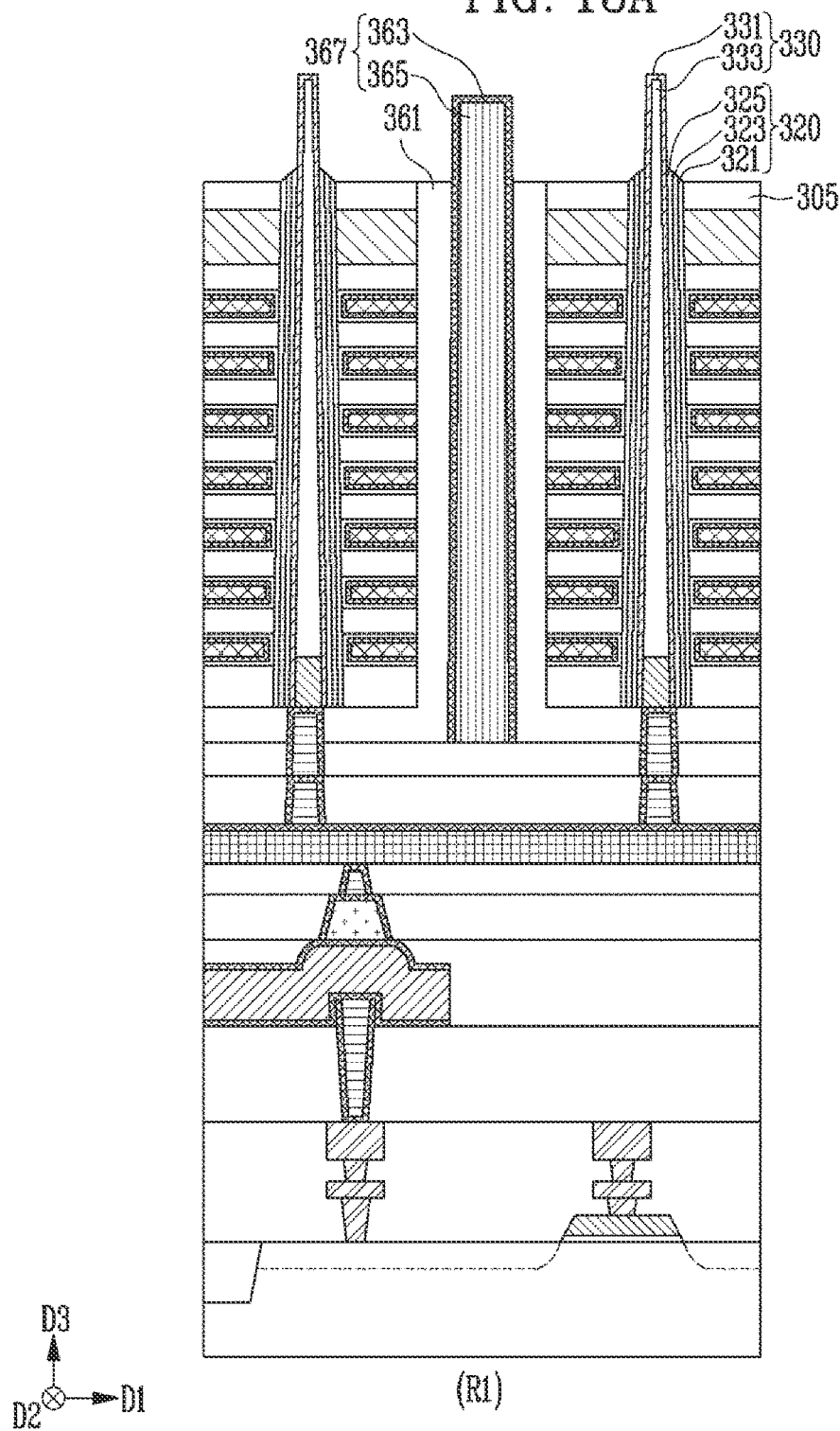

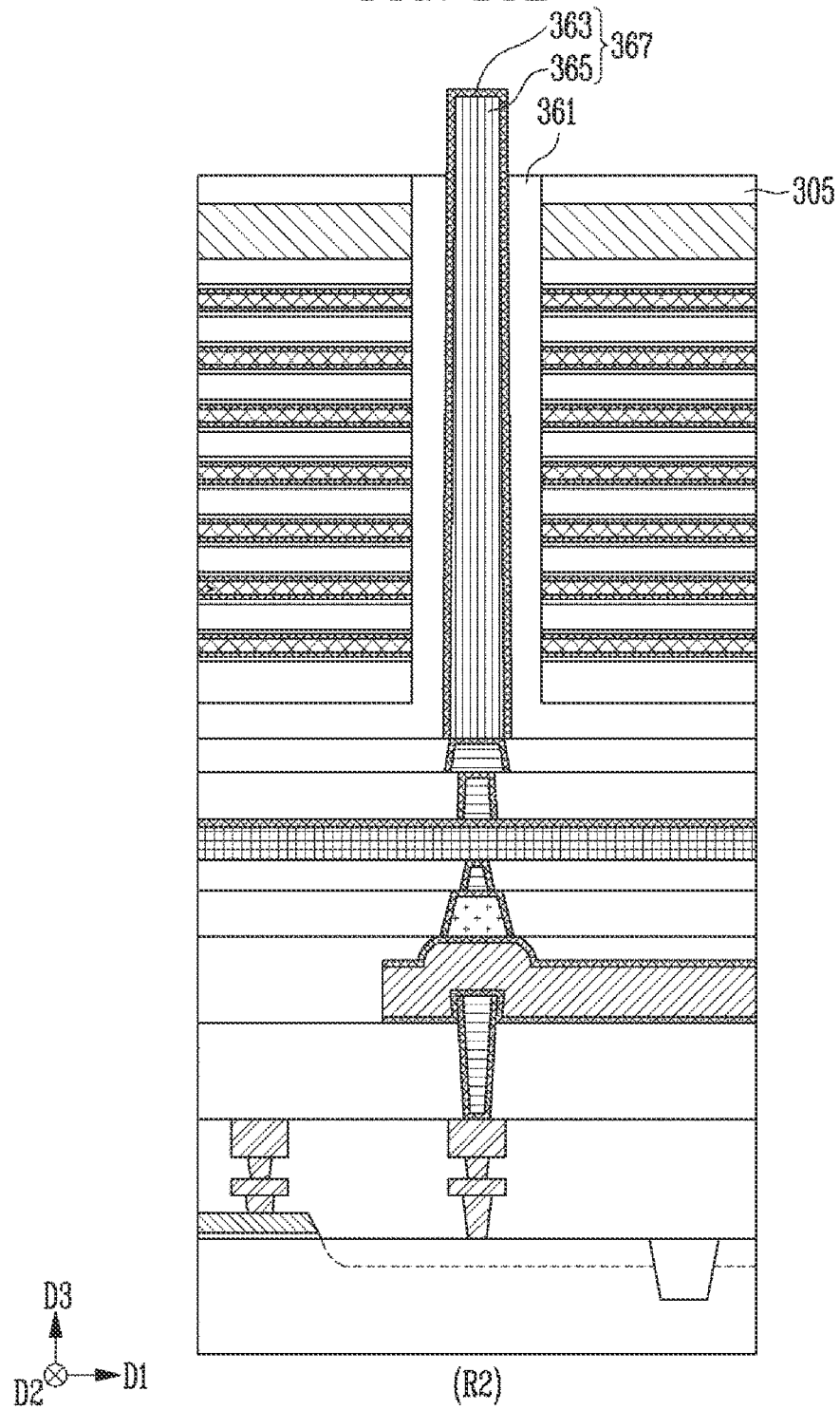

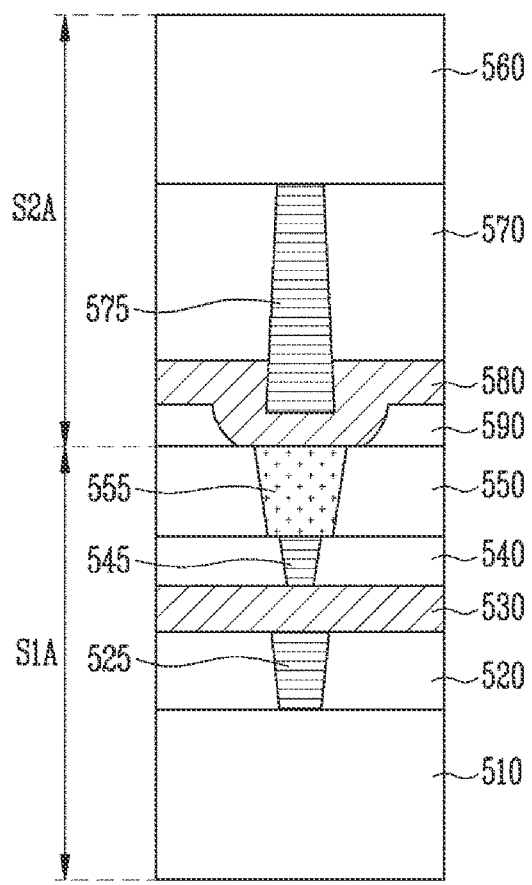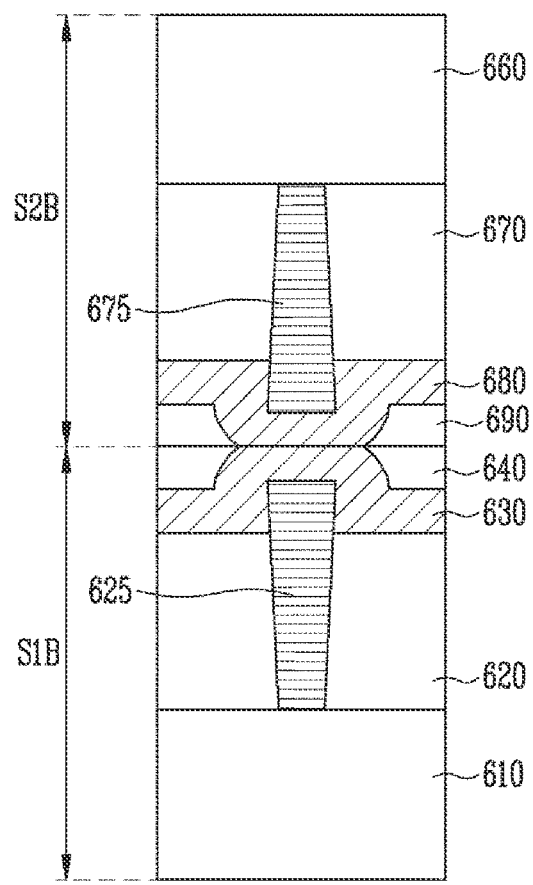

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2020-0154975 filed on Nov. 18, 2020, in the Korean Intellectual Property Office, the entire disclosure of which is incorporated by reference herein.

BACKGROUND

1. Technical Field

The present disclosure may generally relate to a semiconductor memory device and a manufacturing method of a semiconductor memory device, and more particularly, to a semiconductor memory device including a bonding structure and a manufacturing method of the semiconductor memory device.

2. Related Art

A semiconductor memory device may include a memory cell array including a plurality of memory cells and a peripheral circuit for controlling an operation of the memory cell array.

The peripheral circuit and the memory cell array may be provided by using continuously performed processes. When the processes are continuously performed, heat generated in a subsequent process may cause a defect of a structure which has already been formed. Therefore, the operational reliability of the semiconductor memory device may be deteriorated.

SUMMARY

In accordance with an embodiment of the present disclosure, there may be provided a semiconductor memory device including: an insulating layer covering a peripheral circuit structure; a contact structure connected to the peripheral circuit structure while penetrating the insulating layer, the contact structure including a protrusion part protruding vertically through the insulating layer; a first conductive line including a bending part surrounding and on top of the protrusion part of the contact structure; a conductive bonding pad bonded to the bending part of the first conductive line; and a memory structure connected to the conductive bonding pad.

In accordance with an embodiment of the present disclosure, there may be provided a semiconductor memory device including: a first circuit structure; a first conductive line connected to the first circuit structure; a second conductive line facing the first conductive line; a second circuit structure overlapping with the first circuit structure with the first and second conductive lines interposed therebetween, the second circuit structure connected to the second conductive line; and a first bonding structure disposed between the first conductive line and the second conductive line, the first bonding structure configured with bonding insulating layers boned to each other, wherein one of the first conductive line and the second conductive line includes a region protruding toward the other of the first conductive line and the second conductive line.

In accordance with an embodiment of the present disclosure, there may be provided a method of manufacturing a semiconductor memory device, the method including: forming a first circuit structure; forming an insulating layer on the first circuit structure; forming a contact structure connected to the first circuit structure while penetrating the insulating layer, the contact structure including a protrusion part protruding farther than the insulating layer in a vertical direction opposite to a direction toward the first circuit structure; forming a first conductive line including a horizontal part on the insulating layer and a bending part in contact with the protrusion part of the contact structure, the bending part protruding farther in the vertical direction than the horizontal part; forming a first bonding insulating layer covering the horizontal part of the first conductive line; planarizing a surface of the first bonding insulating layer such that the bending part of the first conductive line is exposed; forming a semiconductor structure including a second circuit structure, a second conductive line in contact with the second circuit structure, and a conductive bonding pad connected to the second conductive line; and bonding the conductive bonding pad of the semiconductor structure to the bending part.

BRIEF DESCRIPTION OF THE DRAWINGS

Illustrative embodiments will now be described hereinafter with reference to the accompanying drawings; however, other embodiments may take on different forms. Therefore, possible embodiments of the present teachings should not be construed as being limited to the specific embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

FIGS. 3A and 3B are sectional views of a semiconductor memory device in accordance with an embodiment of the present disclosure.

FIGS. 12A, 12B, 13A, 13B, 14A, and 14B are sectional views illustrating an embodiment of subsequent processes continued after the bonding process.

FIGS. 16A and 16B are sectional views schematically illustrating bonding structures between first and second semiconductor structures in accordance with embodiments of the present disclosure.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Hereinafter, the terms "first," "second," etc. are used to distinguish one component from another component and are not meant to imply a specific number or order of components. The terms may be used to describe various components, but the components are not limited by the terms.

Embodiments may provide a semiconductor memory device and a manufacturing method of a semiconductor memory device, which can improve the operational reliability.

Figure 1:
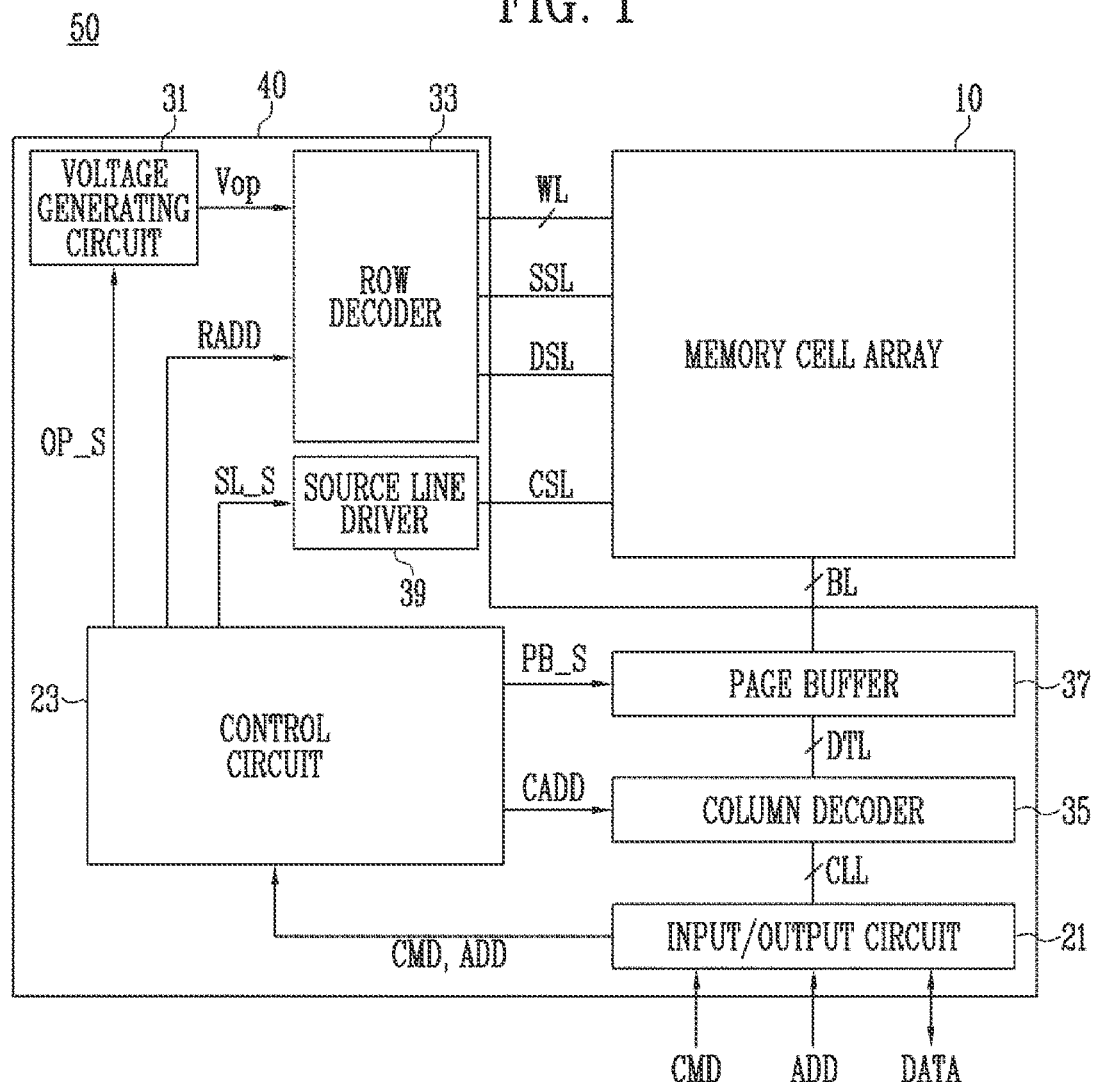
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 50 may include a peripheral circuit 40 and a memory cell array 10.

The peripheral circuit 40 may be configured to perform a program operation for storing data in the memory cell array 10, a read operation for outputting data stored in the memory cell array 10, or an erase operation for erase data stored in the memory cell array 10. In an embodiment, the peripheral circuit 40 may include an input/output circuit 21, a control circuit 23, a voltage generating circuit 31, a row decoder 33, a column decoder 35, a page buffer 37, and a source line driver 39.

A peripheral circuit structure including the peripheral circuit 40 and a circuit structure including the memory cell array 10 may be electrically connected to each other through a bonding structure. In an embodiment, the memory cell array 10 may include a single memory structure provided through a continuous process. In another embodiment, the memory cell array may include two or more memory structures electrically connected to each other through a bonding structure.

Figure 2:
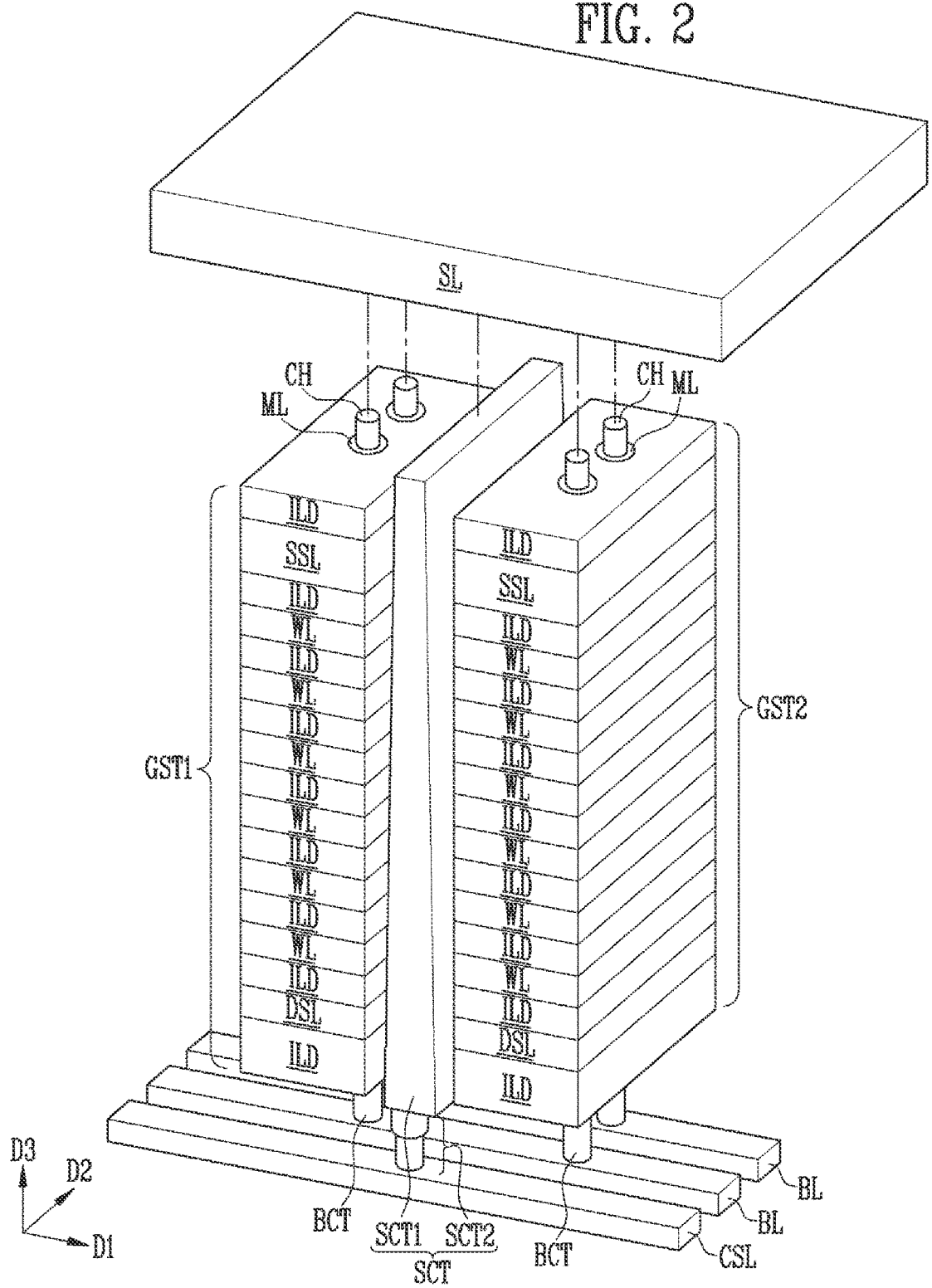
FIG. 2 is a perspective view illustrating a memory structure of a semiconductor memory device in accordance with an embodiment of the present disclosure.

Each memory structure of the memory cell array 10 may include a plurality of memory cells in which data is stored. In an embodiment, each memory structure of the memory cell array 10 may include three-dimensionally arranged memory cells. As illustrated in FIG. 2, each memory structure of the memory cell array 10 may be connected to at least one drain select line DSL, a plurality of word lines WL, at least one source select line SSL, a plurality of bit lines BL, and a common source line CSL.

The input/output circuit 21 may transfer, to the control circuit 23, a command CMD and an address ADD, which are transferred from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may, for example, generate various operating voltages Vop used for a program operation, a read operation, and an erase operation in response to the operation signal OP_S.

The row decoder 33 may transfer the operating voltages to the drain select line DSL, the word lines WL, and the source select line SSL in response to the row address RADD.

As shown in FIG. 1, the column decoder 35 may transmit data DATA input from the input/output circuit 21 to the page buffer 37 or transmit data DATA stored in the page buffer 37 to the input/output circuit 21 in response to the column address CADD. The column decoder 35 may exchange data DATA with the input/output circuit 21 through column lines CLL. The column decoder 35 may exchange data DATA with the page buffer 37 through data lines DTL.

The page buffer 37 may arbitrarily store data DATA received through the bit lines BL in response to the page buffer control signal PB_S and may sense a voltage or current of the bit lines BL in a read operation.

The source line driver 39 may control a voltage applied to the common source line CSL in response to the source line control signal SL_S.

FIG. 2 is a perspective view illustrating a memory structure of a semiconductor memory device in accordance with an embodiment of the present disclosure.

Referring to FIG. 2, the memory structure may include gate stack structures GST1 and GST2, channel structures CH penetrating each of the gate stack structures GST1 and GST2, and a memory layer ML surrounding each of sidewalls of the channel structures CH.

The gate stack structures GST1 and GST2, as illustrated in FIG. 2, may be disposed between a first level at which conductive lines BL and CSL are disposed and a second level at which a source layer SL is disposed.

The source layer SL may extend along a first direction D1 and a second direction D2, in which axes intersecting each other face. The source layer SL may include a doped semiconductor layer, for example, a doped silicon layer doped with an n-type impurity.

The conductive lines BL and CSL may include bit lines BL and a common source line CSL, which are spaced apart from each other at the first level. In addition, the bit lines BL and the common source line CSL may extend in parallel to each other. In an embodiment, the bit lines BL and the common source line CSL may extend in the first direction D1, and be arranged to be spaced apart from each other in the second direction D2.

The gate stack structures GST1 and GST2 may be spaced apart from each other, for example, in the first direction D1. Each of the gate stack structures GST1 and GST2 may include interlayer insulating layers ILD and conductive patterns DSL, WL, and SSL. The interlayer insulating layers ILD and the conductive patterns DSL, WL, and SSL of each of the gate stack structures GST1 and GST2 may extend in the first direction D1 and the second direction D2 to surround a plurality of channel structures CH.

As illustrated in FIG. 2, the interlayer insulating layers ILD and the conductive patterns DSL, WL, and SSL may be alternately stacked in a third direction D3 toward the source layer SL from the conductive lines BL and CSL. The third direction D3 may be a vertical direction orthogonal to the source layer SL extending along the first direction D1 and the second direction D2.

The conductive patterns DSL, WL, and SSL may include at least one drain select line DSL, a plurality of word lines WL, and at least one source select line SSL. The word lines WL may be disposed between the drain select line DSL and the source select line SSL, and be spaced apart from each other in the third direction D3. The drain select line DSL may be disposed closer to the conductive lines BL and CSL than the plurality of word lines WL. The source select line SSL may be disposed closer to the source layer SL than the plurality of word lines WL.

As illustrated in FIG. 2, the channel structures CH may extend in the third direction D3 to penetrate the gate stack structures GST1 and GST2. The channel structures CH may be commonly in contact with the source layer SL. The channel structures CH may be electrically connected to the bit lines BL via bit line contacts BCT. More specifically, a single bit line BL and a single channel structure CH may be connected to each other via a single bit line contact BCT disposed between the single bit line BL and the single channel structure CH.

The memory layers ML may be disposed between the channel structures CH and the gate stack structures GST1 and GST2. More specifically, a single memory layer ML may be disposed between a single channel structure CH and a single gate stack structure GST1 or GST2.

The channel structures CH may protrude farther toward the source layer SL than the memory layers ML and the gate stack structures GST1 and GST2.

The source layer SL may be connected to the common source line via a source contact SCT. The source contact SCT may be spaced apart from the gate stack structure GST1 and GST2, and be disposed between the source layer SL and the common source layer CSL. The source contact SCT may include a first source contact SCT1 and a second source contact SCT2, as illustrated in FIG. 2.

The first source contact SCT1 may be disposed between the gate stack structures GST1 and GST2. The first source contact SCT1 may be in contact with the source layer SL. The first source contact SCT1 may extend in a direction intersecting the common source line CSL and the bit lines BL. For example, in an embodiment, the first source contact SCT1 may extend in the second direction D2.

The second source contact SCT2 may be disposed between the first source contact SCT1 and the common source line CSL.

Figure 3A:
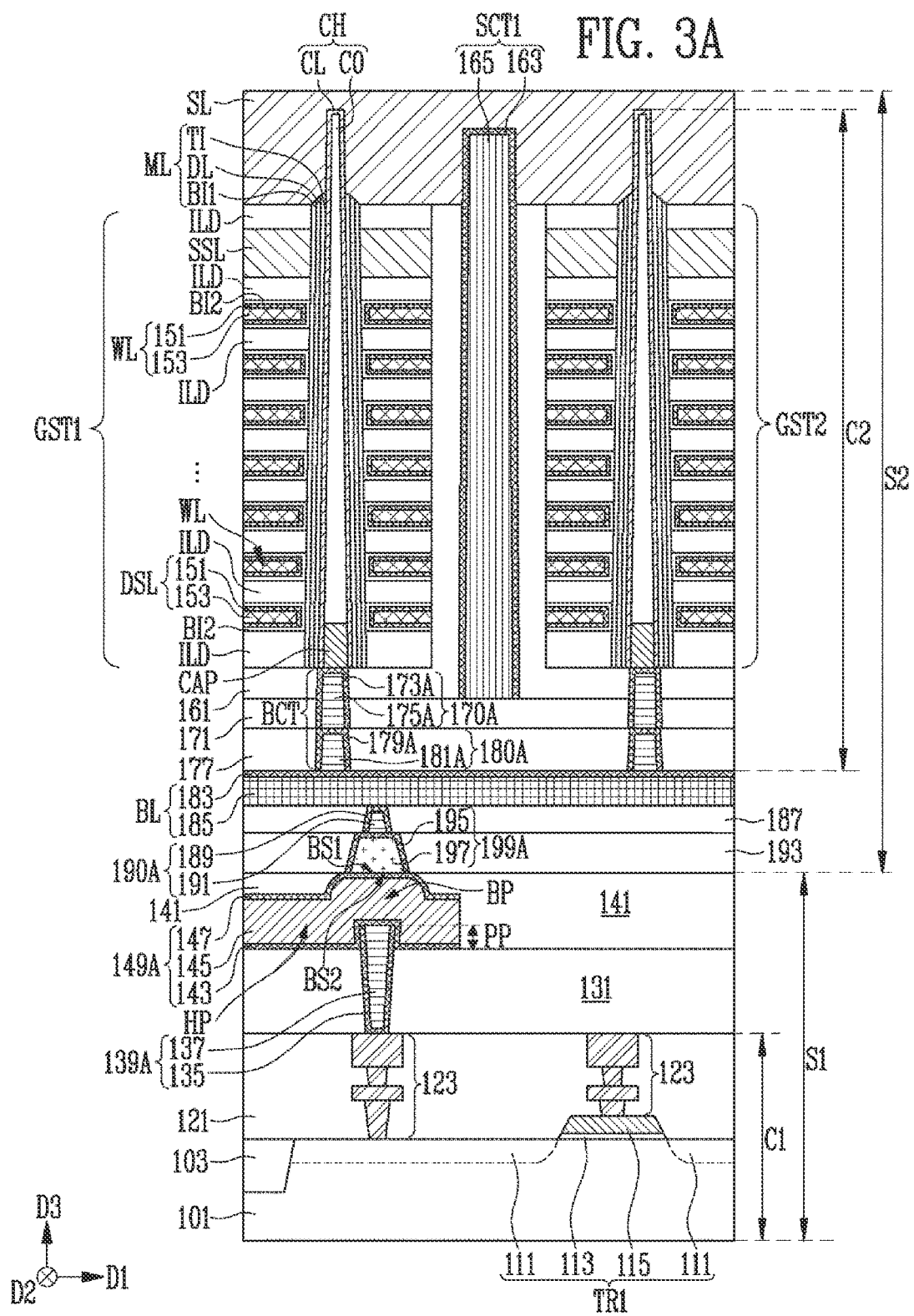

FIGS. 3A and 3B are sectional views of a semiconductor memory device in accordance with an embodiment of the present disclosure.

FIGS. 3A and 3B illustrate a state in which a first semiconductor structure S1 and a second semiconductor structure S2 are bonded to each other. The second semiconductor structure S2 may include the memory structure shown in FIG. 2. FIG. 3A illustrates a sectional view of the semiconductor memory device taken along line overlapping with a bit line BL, and FIG. 3B illustrates a sectional view of the semiconductor memory device taken along line overlapping with a common source layer CSL. Hereinafter, a first direction D1, a second direction D2, and a third direction D3 are equal to the first direction D1, the second direction D2, and the third direction D3, which are defined with reference to FIG. 2.

Referring to FIGS. 3A and 3B, the first semiconductor structure S1 may include a first circuit structure C1, a first insulating layer 131 covering the first circuit structure C1, contact structures 139A and 139B penetrating the first insulating layer 131, a first bonding insulating layer 141 disposed on the first insulating layer 131, and first conductive lines 149A and 149B connected to the first circuit structure C1 via the contact structures 139A and 139B.

More specifically, the first circuit structure C1 may constitute a peripheral circuit structure for controlling a memory device. In an embodiment, the first circuit structure C1 may include a substrate 101, a plurality of transistors TR1 and TR2 formed on the substrate 101 in active regions, and interconnections 123 connected to the transistors TR1 and TR2.

As illustrated in FIGS. 3A and 3B, the active regions may be defined as partial regions of the substrate 101, which are partitioned by isolation layers 103. Each of the transistors TR1 and TR2 may include a gate insulating layer 113, a gate electrode 115, and junctions 111. The gate insulating layer 113 and the gate electrode 115 may be stacked on the substrate 101 in the active region. The junctions 111 may be provided as a source region and a drain region. The junctions 111 may be provided by doping at least one of an n-type impurity and a p-type impurity into the active regions exposed at both sides of the gate electrode 115.

The transistors TR1 and TR2 may constitute a portion of the peripheral circuit 40 shown in FIG. 1. In an embodiment, the transistors TR1 and TR2 may include a first transistor TR1 constituting the page buffer 37 shown in FIG. 1 and a second transistor TR2 constituting the source line driver 39 shown in FIG. 1.

The interconnections 123 may include a plurality of conductive patterns connected to the first transistor TR1 and the second transistor TR2, and be formed in various structures.

As illustrated in FIGS. 3A and 3B, the gate insulating layer 113, the gate electrode 115, the junctions 111, and the interconnections 123 may be buried in a lower insulating structure 121 formed on the substrate 101. The lower insulating structure 121 may include at least two insulating layers.

The first insulating layer 131 may be disposed on the lower insulating structure 121, and extend to cover the first circuit structure C1.

The contact structures 139A and 139B may include various conductive materials. In an embodiment, each of the contact structures 139A and 139B may include, for example, a conductive metal barrier layer 135 and a metal layer 137.

The contact structures 139A and 139B may penetrate the first insulating layer 131 to be in contact with some of the interconnections 123. In an embodiment, the contact structures 139A and 139B may, for example, include a contact structure 139A connected to the first transistor TR1 via one of the interconnections 123 and a contact structure 139B connected to the second transistor TR2 via another of the interconnections 123.

The contact structures 139A and 139B may extend in the third direction D3 opposite to a direction toward the first circuit structure C1. The contact structures 139A and 139B may respectively include protrusion parts PP protruding farther in the third direction D3 than the first insulating layer 131.

As illustrated in FIG. 3A and FIG. 3B, the conductive lines 149A and 149B may be in contact with the contact structures 139A and 139B, respectively. Each of the first conductive lines 149A and 149B may include a bending part BP protruding in the third direction D3 and a horizontal part extending onto the first insulating layer 131 from the bending part BP. The bending part BP may surround the protrusion part PP of the contact structure 139A or 139B corresponding to the bending part BP, and may have a bent shape corresponding to the protrusion part PP. The bending part BP may be in contact with the protrusion part PP of the contact structure 139A or 139B corresponding to the bending part BP.

The first conductive lines 149A and 149B may include various conductive materials. As illustrated in FIGS. 3A and 3B, in an embodiment, each of the first conductive lines 149A and 149B may include a first conductive metal barrier layer 143, a metal layer 145, and a second conductive metal barrier layer 147. The first conductive metal barrier layer 143 may extend along a surface of the protrusion part PP of the contact structure 139A or 139B corresponding to the first conductive metal barrier layer 143 and a surface of the first insulating layer 131. For example, the metal layer 145 may include a metal such as aluminum and may be formed on the first conductive metal barrier layer 143. The second conductive metal barrier layer 147 may be formed on the metal layer 145 and may be made of various materials. In an embodiment, the second conductive metal barrier layer 147 may be configured as a titanium nitride layer.

The first bonding insulating layer 141 may extend to cover the horizontal part HP of each of the first conductive lines 149A and 149B. A surface BS2 of the bending part BP of each of the first conductive lines 149A and 149B, which faces in the third direction D3, is not covered by the first bonding insulating layer 141, but may be directly bonded to the second semiconductor structure S2.

The second semiconductor structure S2 may include second conductive lines BL and CSL, a source line SL overlapping with the second conductive lines BL and CSL, a second circuit structure C2 disposed between the source layer SL and the second conductive lines BL and CSL, pad contacts 190A and 190B connected to the second conductive lines BL and CSL, conductive bonding pads 199A and 199B connected to the second conductive lines CSL via the pad contacts 190A and 190B, and a second bonding insulating layer 193 bonded to the first bonding insulating layer 141.

The second conductive lines BL and CSL may include the bit line BL and the common source line CSL, which are described with reference to FIG. 2. The second circuit structure C2 may be connected to the bit line BL and the common source line CSL. Each of the bit line BL and the common source line CSL may be formed of various conductive materials. For example, in an embodiment, the bit line BL and the common source line CSL may include a conductive metal barrier layer 183 and a metal layer 185.

The second circuit structure C2 may include a memory structure, a first source contact SCT1, a second source contact SCT2, and bit line contacts BCT. The memory structure may include gate stack structures GST1 and GST2, channel structures CH, and memory layers ML as described with reference to FIG. 2.

A source select line SSL, word lines WL, and a drain select line DSL of each of the gate stack structure GST1 and GST2 may include various conductive materials. For example, in an embodiment, the source select line SSL may be configured as a doped semiconductor layer such as a doped silicon layer. The word lines WL and the drain select line DSL may be formed of the same conductive material. In an embodiment, each of the word lines WL and the drain select lines DSL may include a metal layer 153 and a conductive metal barrier layer 151, wherein the metal layer 153 may be disposed between interlayer insulating layers ILD adjacent to each other in the third direction D3. The conductive metal barrier layer 151 may be disposed between each of sidewalls of the channel structures CH and the metal layer 153, and extend between the metal layer 153 and the interlayer insulating layers ILD.

Each of the channel structures CH may include a core insulating layer CO and a channel layer CL, wherein the channel layer CL may penetrate the gate stack structure GST1 or GST2 corresponding to the channel layer CL, and may protrude farther in the third direction D3 than the gate stack structure GST1 or GST2. In an embodiment, the channel layer CL may include a silicon layer. The core insulating layer CO may fill a portion of a central region of the channel structure CH, which corresponds to the core insulating layer CO. Another portion of the central region of the channel structure CH may be filled with a capping pattern CAP.

The capping pattern CAP may be disposed between the bit line contact BCT and the core insulating layer CO, and may be configured as a doped semiconductor layer. In an embodiment, the capping pattern CAP may include doped silicon layer doped with an n-type impurity.

Each memory layer ML may be disposed between the channel layer CL and the gate stack structure GST1 or GST2. Each memory layer ML may include a first blocking insulating layer BI1 surrounding a sidewall of the channel layer CL, a data storage layer DL between the first blocking insulating layer BI1 and the channel layer CL, and a tunnel insulating layer TI between the data storage layer DL and the channel layer CL.

A second blocking insulating layer BI2 may surround a sidewall of the memory layer ML. The second blocking insulating layer BI2 may include an insulating material having a dielectric constant higher than that of the first blocking insulating layer BI1. The second blocking insulating layer BI2 may extend between the interlayer insulating layers ILD and each of the source select line SSL, the word lines WL, and the drain select line DSL.

The first blocking insulating layer BI1 and the second blocking insulating layer BI2 may prevent a phenomenon in which charges are introduced to the source select line SSL, the word lines WL, and the drain select line DSL due to tunneling. For example, in an embodiment, the first blocking insulating layer BI1 may include a silicon oxide layer, and the second blocking insulating layer BI2 may include a metal oxide layer such as an aluminum oxide layer or a hafnium oxide layer, but are not limited thereto.

Partial regions of the data storage layer DL, which are formed at intersection portions of the word lines WL and the channel layer CL, may be used as a data storage region. In an embodiment, the data storage layer DL may be configured as a material layer capable of storing data changed using Fowler-Nordheim tunneling. The material layer may include a nitride layer in which charges may be trapped.

The tunnel insulating layer TI may include an insulating material through which charges may tunnel, for example, a silicon oxide layer.

The first source contact SCT1 may be formed of various conductive materials. In an embodiment, the first source contact SCT1 may include a conductive metal barrier layer 163 and a metal layer 165. The first source contact SCT1 may penetrate a second insulating layer 161 disposed between the gate stack structures GST1 and GST2, and extend in parallel to the channel structures CH. The first source contact SCT1 may be disposed between the gate stack structures GST1 and GST2, and extend in the third direction D3. The second insulating layer 161 may extend to cover a surface of each of the stack structures GST1 and GST2, which faces the bit line BL and the common source line CSL.

At least one insulating layer may be further disposed between the bit line BL and the second insulating layer 161. In an embodiment, a third insulating layer 171 and a fourth insulating layer 177 may be disposed between the bit line BL and the second insulating layer 161. The third insulating layer 171 and the fourth insulating layer 177 may extend between the second insulating layer 161 and the common source line CSL.

Each of the bit line contacts BCT may penetrate the second insulating layer 161, the third insulating layer 171, and the fourth insulating layer 177 to be connected to the capping layer CAP and the channel layer CL, which correspond thereto. Each of the bit line contacts BCT may electrically connect the channel layer CL and the bit line BL, which corresponds thereto, to each other. In an embodiment, each of the bit line contacts BCT may include a first contact plug 170A and a second contact plug 180A. The first contact plug 170A may include a conductive metal barrier layer 173A and a metal layer 175A, which penetrate the second insulating layer 161 and the third insulating layer 171. The second contact plug 180A may include a conductive metal barrier layer 179A and a metal layer 181A, which penetrate the fourth insulating layer 177. The bit line BL may be connected to the channel structures CH via the first contact plug 170A and the second contact plug 180A.

As illustrated in FIG. 3B, the second source contact SCT2 may penetrate the third insulating layer 171 and the fourth insulating layer 177 to be connected to the first source contact SCT1 and the common source line CSL. The second source contact SCT2 may electrically connect the first source contact SCT1 and the common source line CSL to each other. In an embodiment, the second source contact SCT2 may include a third contact plug 170B and a fourth contact plug 180B. The third contact plug 170B may include a conductive metal barrier layer 173B and a metal layer 175B, which penetrate the third insulating layer 171. The fourth contact plug 180B may include a conductive metal barrier layer 179B and a metal layer 181B, which penetrate the fourth insulating layer 177. The common source line CSL may be connected to the first source contact SCT1 via the third contact plug 170B and the fourth contact plug 180B. The common source line CSL may be connected to the source layer SL via the first source contact SCT1 and the second source contact SCT2.

The source layer SL may extend in the first direction D1 and the second direction D2. The source layer SL may be in contact with a partial region of the channel layer CL and the first source contact SCT1. The partial region of the channel layer CL, which is in contact with the source layer SL, may be a portion extending to the inside of the source layer SL from a partial region of the channel layer CL, which is surrounded by the gate stack structures GST1 and GST2.

The pad contacts 190A and 190B may penetrate a fifth insulating layer 187. The fifth insulating layer 187 may, for example, be disposed between the second bonding insulating layer 193 and the bit line BL, and may extend between the second bonding insulating layer 193 and the common source line CSL.

The pad contacts 190A and 190B may be formed of various conductive materials. For example, in an embodiment, each of the pad contacts 190A and 190B may include a conductive metal barrier layer 189 and a metal layer 191. The pad contacts 190A and 190B may include a first pad contact 190A connected to the bit line BL and a second pad contact 190B connected to the common source line CSL.

The conductive bonding pads 199A and 199B may penetrate the second bonding insulating layer 193. The conductive bonding pads 199A and 199B may be formed of various conductive materials such as a conductive metal barrier layer 195 and a metal layer 197. The conductive metal barrier layer 195 may be disposed between the metal layer 197 and the second bonding insulating layer 193, and may extend along a surface of the metal layer 197, which faces the corresponding bit line BL or the corresponding common source line CSL.

The metal layer 197 may include various metals. The metal layer 197 of each of the conductive bonding pads 199A and 199B may be bonded to the bending part BP of the first conductive line 149A or 149B corresponding thereto.

In an embodiment, the metal layer 197 of each of the conductive bonding pads 199A and 199B may be bonded to the second conductive metal barrier layer 147 of the first conductive line 149A or 149B corresponding thereto. In an embodiment, the metal layer 197 may include copper, and the second conductive metal barrier layer 147 may include a titanium nitride layer. Accordingly, the bonding structure between the conductive bonding pads 199A and 199B and the bending parts BP of the first conductive lines 149A and 149B may be configured as a bonding structure between the copper and the titanium nitride layer. However, the metal layer 197 and the second conductive metal barrier layer 147 are not limited to the copper and the titanium nitride layer.

The conductive bonding pads 199A and 199B may include a first conductive bonding pad 199A and a second conductive bonding pad 199B. The first conductive bonding pad 199A may be connected to the bit line via the first pad contact 190A. The second conductive bonding pad 199B may be connected to the common source line CSL via the second pad contact 190B.

The first bonding insulating layer 141 and the second bonding insulating layer 187 may be made of various insulating materials. For example, in an embodiment, the first bonding insulating layer 141 and the second bonding insulating layer 187 may include a silicon oxide layer, a silicon nitride layer doped with carbon, etc.

Each of the bending parts BP of the first conductive lines 149A and 149B may have a width wider than that of the conductive bonding pad 199A or 199B corresponding thereto. The metal layer 197 of the conductive bonding pad 199A or 199B may include a bonding surface BS1 facing the bending part BP corresponding to the bonding layer 197. When the surface BS2 of the bending part BP, which faces in the third direction D3, is formed wider than the bonding surface BS1, the whole of the bonding surface BS1 of the metal layer 197 may be in contact with the bending part BP corresponding to the metal layer 197. Accordingly, a phenomenon may be mitigated or prevented, in which the bonding surface BS1 of the metal layer 197 is in contact with the second bonding insulating layer 187. Properties of the first bonding insulating layer 141 and the second bonding insulating layer 187 are not limited by considering a phenomenon in which a metal is diffused from the metal layer 197, and the range in which the properties of the first bonding insulating layer 141 and the second bonding insulating layer 187 are selected may be widened. Because it is possible to mitigate or prevent a phenomenon in which the bonding surface BS1 of the metal layer 197 is in contact with the second bonding insulating layer 187, each of the first bonding insulating layer 141 and the second bonding insulating layer 187 may be formed of a silicon oxide layer rather than a diffusion barrier.

Although not shown in the drawings, in another embodiment, the bonding surface BS1 of the metal layer 197 may be formed wider than the surface BS2 of the bending part BP and the metal layer 197 may be contact with the first bonding insulating layer 141. In this case, the first bonding insulating layer 141 is formed as a silicon nitride layer doped with carbon, so that the diffusion of the metal from the metal layer 197 can be blocked by the first bonding insulating layer 141.

A process of forming the first semiconductor structure S1 and a process of forming the second semiconductor structure are not continuous but may be performed individually, thus providing flexibility in manufacturing. Accordingly, heat generated in a process of forming the second circuit structure C2 of the second semiconductor structure S2 has no influence on the first circuit structure C1 of the first semiconductor structure S1, and thus a defect of the semiconductor memory device due to heat may be reduced.

FIGS. 4A to 4G are sectional views illustrating a process of forming a first semiconductor structure in accordance with an embodiment of the present disclosure. FIGS. 4A to 4G illustrate sectional views of a first region R1 in which the page buffer 37 of the peripheral circuit 40 shown in FIG. 1 is disposed and a second region R2 in which the source line driver 39 of the peripheral circuit 40 shown in FIG. 1 is disposed.

Figure 4A:
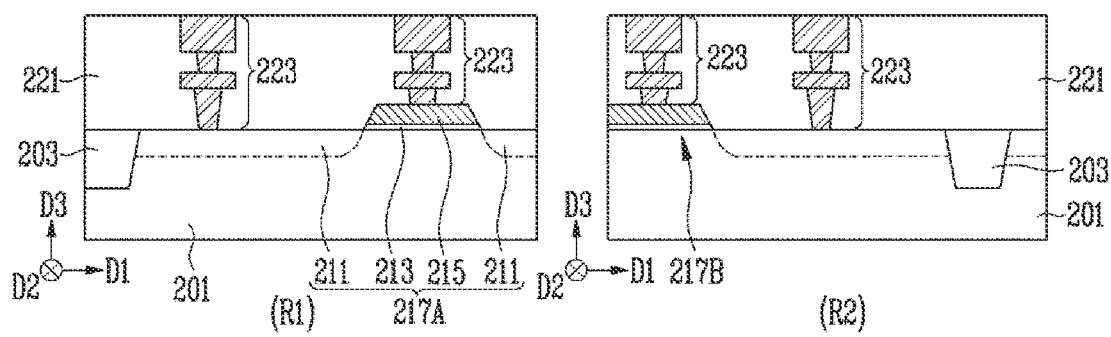
FIGS. 4A, 4B, 4C, 4D, 4E, 4F, and 4G are sectional views illustrating a process of forming a first semiconductor structure in accordance with an embodiment of the present disclosure.

FIG. 4A illustrates sectional views showing a process of forming a first circuit structure.

Referring to FIG. 4A, the first circuit structure may be configured as a peripheral circuit structure. In an embodiment, the peripheral circuit structure may include a first transistor 217A constituting a page buffer, a second transistor 217B constituting a source line driver, and interconnections 223 connected to the first transistor 217A and the second transistor 217B.

The process of forming the first circuit structure configured as the peripheral circuit structure may include a process of forming the first transistor 217A and the second transistor 217B and a process of forming the interconnections 223 which are connected to the first transistor 217A and the second transistor 217B and are buried in a lower insulating structure 221.

The process of forming the first transistor 217A and the second transistor 217B may include a process of forming isolation layers 203 which partition active regions of a first substrate 201, a process of forming a stack structure of a gate insulating layer 213 and a gate electrode 215 on the first substrate 201 in each of the active regions, and a process of injecting an impurity such that junctions 211 are defined in the active regions at both sides of the gate electrode 215. The first substrate 201 may extend in a first direction D1 and a second direction D2 in which axes intersecting each other face.

As illustrated in FIG. 4A, each of the interconnections 223 may include conductive patterns stacked in a third direction D3 opposite to a direction toward the first substrate 201. The third direction D3 may be a vertical direction orthogonal to a surface of the first substrate 201. The conductive patterns of each of the interconnections 223 may be formed in various structures. The lower insulating structure 221 may include at least two insulating layers stacked in the third direction D3.

Figure 4B:
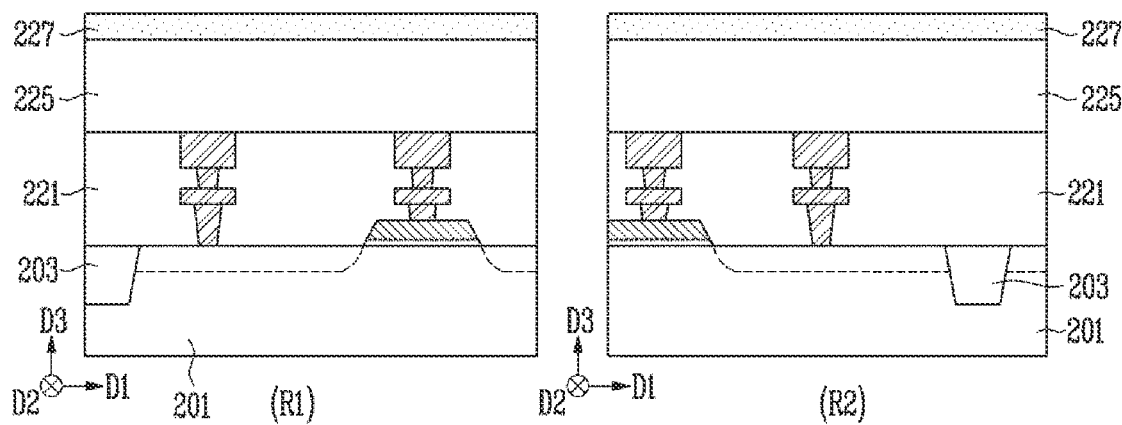
Figure 4C:
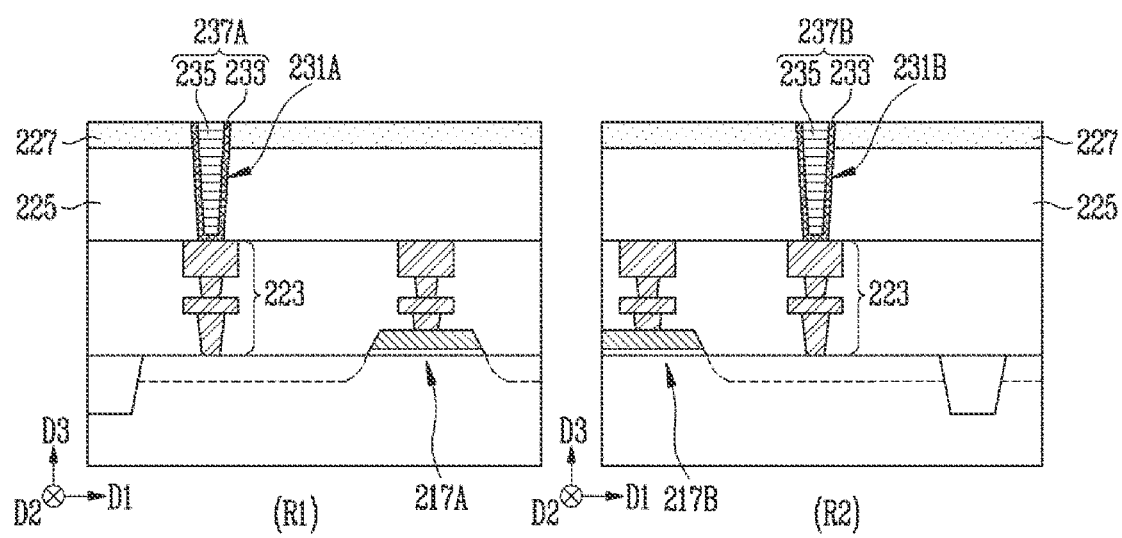
Figure 4D:
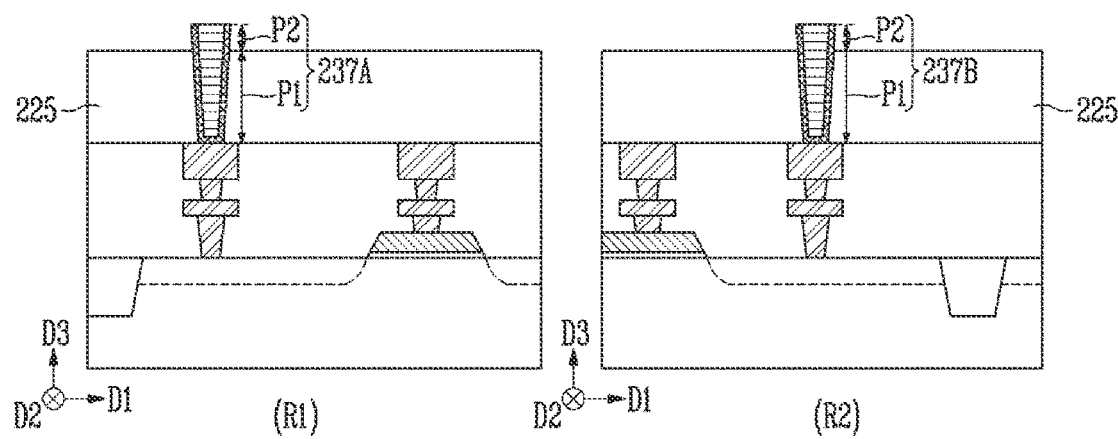

FIGS. 4B to 4D illustrate sectional views showing a process of forming contact structures including protrusion parts.

Referring to FIG. 4B, a first insulating layer 225 may be formed on the first circuit structure configured as the peripheral circuit structure. Subsequently, a sacrificial layer 227 may be formed on the first insulating layer 225. The sacrificial layer 227 may include a material having an etch selectivity with respect to the first insulating layer 225. In an embodiment, the first insulating layer 225 may include a silicon oxide layer, and the sacrificial layer 227 may include a silicon nitride layer, but are not limited thereto.

Referring to FIG. 4C, openings 231A and 231B may be formed to penetrate the sacrificial layer 227 and the first insulating layer 225. The openings 231A and 231B may include a first opening 231A exposing an interconnection connected to the first transistor 217A among the interconnections 223 and a second opening 231B exposing an interconnection connected to the second transistor 217B among the interconnections 223.

Subsequently, contact structures 237A and 237B may be formed to fill the first opening 231A and second opening 231B. In an embodiment, for example, the process of forming the contact structures 237A and 237B may include a process of forming a conductive metal barrier layer 233 along surfaces of the first opening 231A and the second opening 231B, a process of forming a metal layer 235 filling central regions of the first opening 231A and the second opening 231B on the conductive metal barrier layer 233, and a process of planarizing the metal layer 235 and the conductive metal barrier layer 233 such that the sacrificial layer 227 is exposed.

The contact structure 237A may be connected to the first transistor 217A via the interconnection connected to the first transistor 217A among the interconnections 223, and the contact structure 237B may be connected to the second transistor 271B via the interconnection connected to the second transistor 217B among the interconnections 223.

Referring to FIG. 4D, the first insulating layer 225 may be exposed by selectively removing the sacrificial layer 227 shown in FIG. 4C. Accordingly, an unevenness structure may be defined due to a height difference between the contact structures 237A and 237B and the first insulating layer 225. More specifically, each of the contact structures 237A and 237B may include a penetration part P1 penetrating the first insulating layer 225 and a protrusion part P2 extending in the third direction D3 from the penetration part P1. The protrusion part P2 of each of the contact structures 237A and 237B may protrude farther in the third direction than a level at which a surface of the first insulating layer 225 is disposed.

Figure 4E:
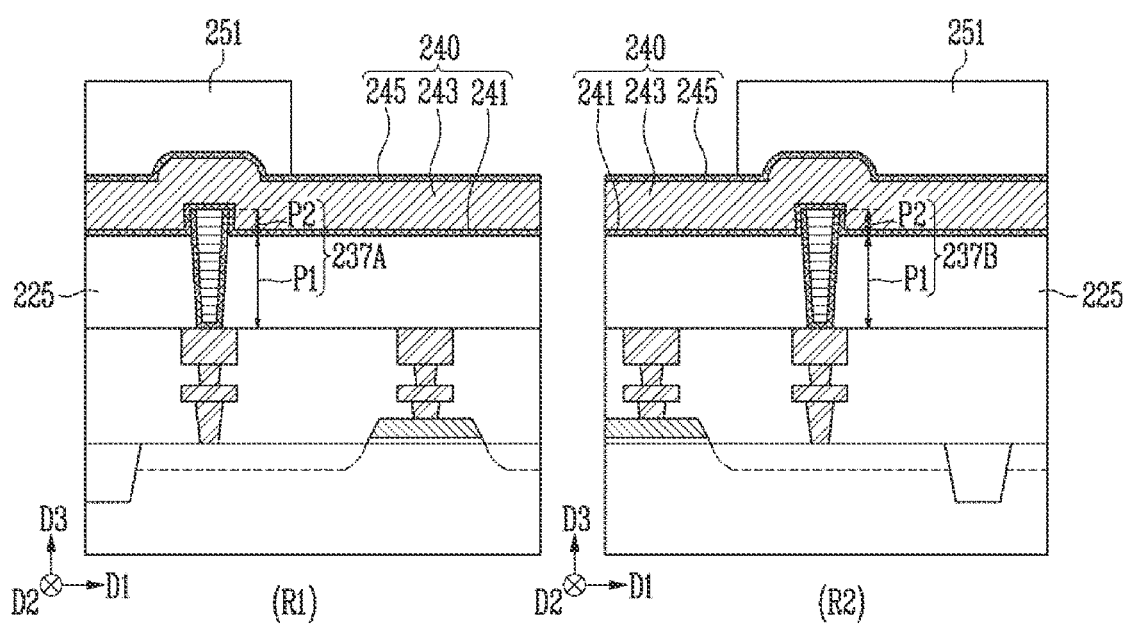
Figure 4F:
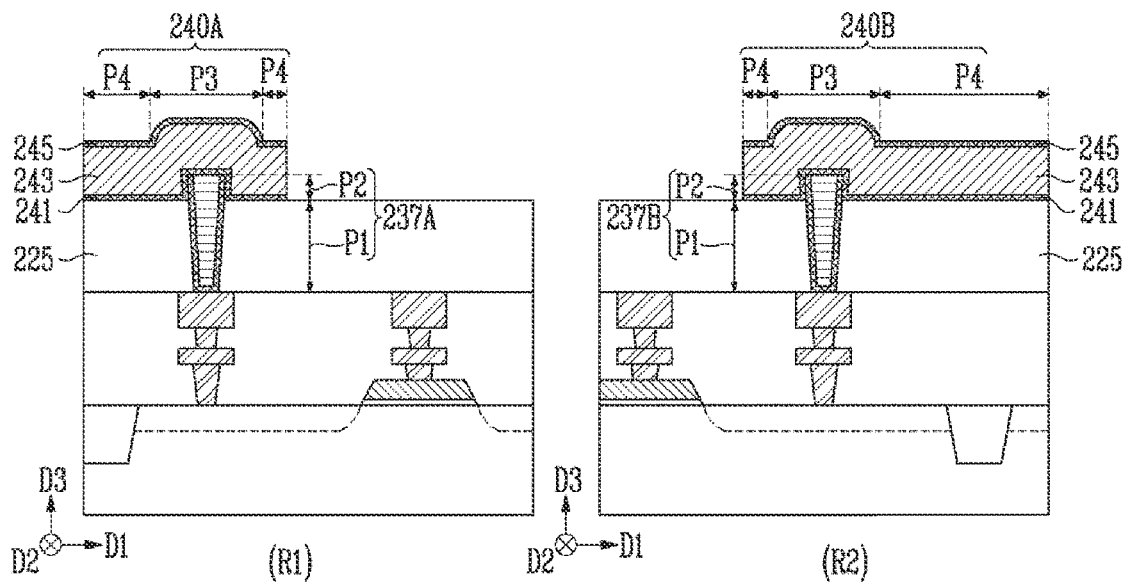

FIGS. 4E and 4F illustrate sectional views showing a process of forming first conductive lines.

Referring to FIG. 4E, a conductive layer 240 may be formed along a surface of the unevenness structure defined by the first insulating layer 225 and the protrusion part P2 of each of the contact structures 237A and 237B. The conductive layer 240 may have an unevenness structure corresponding to the unevenness structure defined by the first insulating layer 225 and the contact structures 237A and 237B.

As illustrated in FIG. 4E, in an embodiment, the process of forming the conductive layer 240 may include a process of forming a first conductive metal barrier layer 241, a process of forming a metal layer 243, and a process of forming a second conductive metal barrier layer 245. The first conductive metal barrier layer 241 may be in contact with the surface of the first insulating layer 225 and a surface of the protrusion part P2 of each of the contact structures 237A and 237B, and may extend along the surface of the first insulating layer 225 and the surface of the protrusion part P2 of each of the contact structures 237A and 237B. The metal layer 243 may be formed on the first conductive metal barrier layer 241, and the second conductive metal barrier layer 245 may be formed on the metal layer 243.

Subsequently, a mask pattern 251 may be formed on the conductive layer 240. The mask pattern 251 may be a photoresist pattern formed by using a photolithography process.

Referring to FIG. 4F, the first conductive metal barrier layer 241, the metal layer 243, and the second conductive metal barrier layer 245 of the conductive layer 240 shown in FIG. 4E may be etched through an etching process using the mask pattern 251 shown in FIG. 4E as an etching barrier. Accordingly, first conductive lines 240A and 240B spaced apart from each other may be defined.

As illustrated in FIG. 4F, each of the first conductive lines 240A and 240B may include a bending part P3 and a horizontal part P4. The bending part P3 may be in contact with the protrusion part P2 of the contact structure 237A or 237B corresponding to the bending part P3, and protrude farther toward the third direction D3 than the horizontal part P4. The bending part P3 may have a bent shape corresponding to the protrusion part P2. The horizontal part P4 may extend onto the first insulating layer 225 from the bending part P3.

Figure 4G:
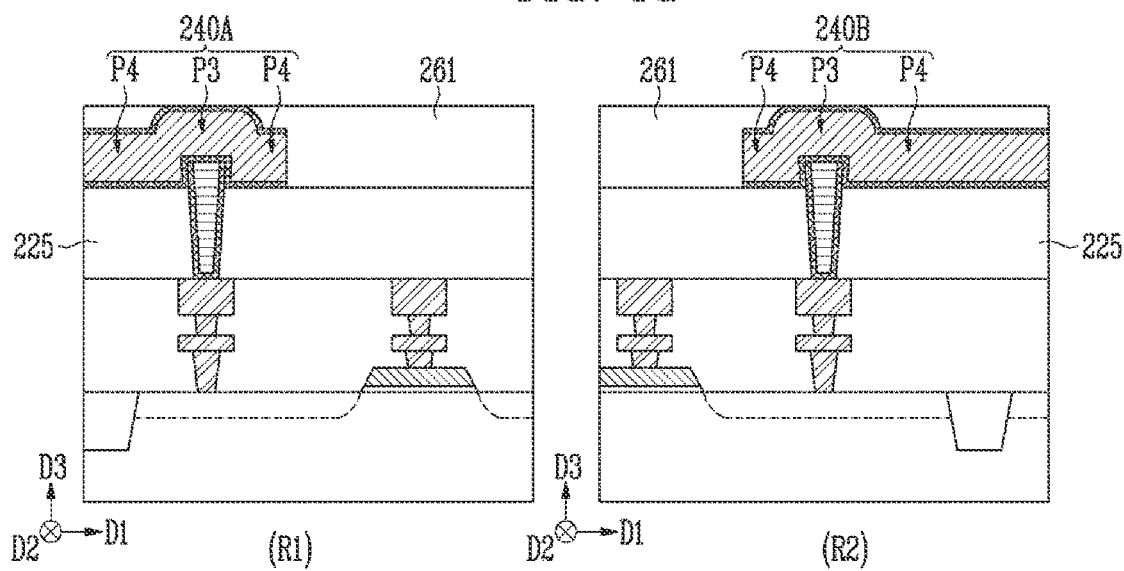

FIG. 4G illustrates sectional views showing a subsequent process continued after the first conductive lines are formed.

Referring to FIG. 4G, a first bonding insulating layer 261 may be formed, which covers the first conductive lines 240A and 240B, wherein the horizontal part P4 of each of the first conductive lines 240A and 240B may be covered by the first bonding insulating layer 261.

Subsequently, a surface of the first bonding insulating layer 261 may be planarized through a planarization process such that the bending part P3 of each of the first conductive lines 240A and 240B may be exposed.

FIGS. 5A, 5B, 6A, 6B, 7A, 7B, 8A, 8B, 9A, 9B, 10A, and 10B are sectional views illustrating a process of forming a second semiconductor structure in accordance with an embodiment of the present disclosure. The second semiconductor structure may be configured as a second circuit structure including a memory structure as described with reference to FIGS. 3A and 3B. Similarly to FIG. 3A, FIGS. 5A, 6A, 7A, 8A, 9A, and 10A illustrate process sectional views taken along an extending direction of a bit line. Similarly to FIG. 3B, FIGS. 5B, 6B, 7B, 8B, 9B, and 10B illustrate process sectional views taken along an extending direction of a common source line.

FIGS. 5A and 5B and 6A, and 6B are sectional views illustrating a process of forming a memory structure of a second circuit structure in accordance with an embodiment of the present disclosure.

Figure 5A:
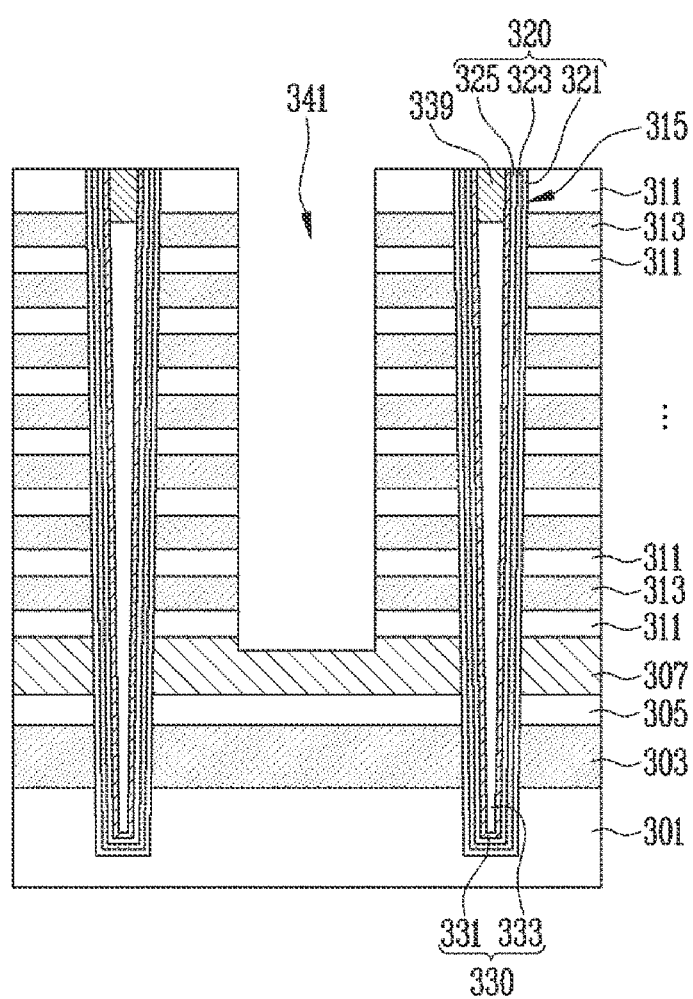
FIGS. 5A, 5B, 6A, 6B, 7A, 7B, 8A, 8B, 9A, 9B, 10A, and 10B are sectional views illustrating a process of forming a second semiconductor structure in accordance with an embodiment of the present disclosure.
Figure 5B:
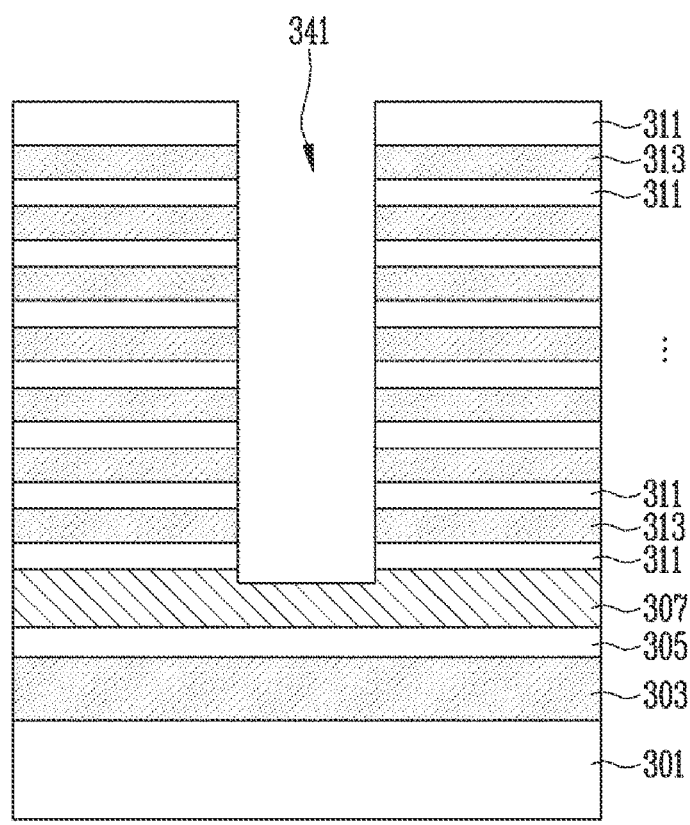

Referring to FIGS. 5A and 5B, an etch stop layer 303 may be formed on a second substrate 301, which may be made of silicon. The etch stop layer 303 may include a material having an etch selectivity with respect to the second substrate 301. In an embodiment, the etch stop layer 303 may include a silicon nitride layer.

Subsequently, a first interlayer insulating layer 305 and a conductive layer 307 may be stacked on the etch stop layer 303, and second interlayer insulating layers 311 and sacrificial layers 313 may be alternately stacked on the conductive layer 307.

Subsequently, channel holes 315 may be formed. The channel holes 315 may penetrate the second interlayer insulating layers 311, the sacrificial layers 313, the conductive layer 307, the first interlayer insulating layer 305, and the etch stop layer 303, and may extend to the inside of the second substrate 301.

Subsequently, a memory layer 320, a channel structure 330, and a capping pattern 339 may be formed in each of the channel holes 315.

As illustrated in FIG. 5A, the process of forming the memory layer 320 may include a process of forming a first blocking insulating layer 321 on a surface of each of the channel holes 315, a process of forming a data storage layer 323 on the first blocking insulating layer 321, and a process of forming a tunnel insulating layer 325 on the data storage layer 323. The tunnel insulating layer 325, the data storage layer 323, and the first blocking insulating layer 321 may be formed of the same materials as the tunnel insulating layer TI, the data storage layer DL, and the first blocking insulating layer BI1, which are described with reference to FIGS. 3A and 3B.

The process of forming the channel structure 330 may include a process of forming a channel layer 331 on a surface of the memory layer 320 and a process of forming a core insulating layer 333 on the channel layer 331. The channel layer 331 may be formed of a semiconductor layer such as a silicon layer.

The process of forming the capping pattern 339 may include a process of removing a portion of the core insulating layer 333 such that a portion of each of the channel holes 315 is opened and a process of filling the portion of each of the channel holes 315 with the capping pattern 339. The capping pattern 339 may include a doped semiconductor layer. For example, in an embodiment, the capping pattern 339 may include a doped silicon layer doped with an n-type impurity.

Subsequently, as illustrated in FIG. 5A and FIG. 5B, a slit 341 penetrating the second interlayer insulating layers 311 and the sacrificial layers 313 may be formed by etching the second interlayer insulating layers 311 and the sacrificial layers 313. The conductive layer 307 may serve as an etch stop layer, while the second interlayer insulating layers 311 and the sacrificial layers 313 are being etched.

Figure 6A:
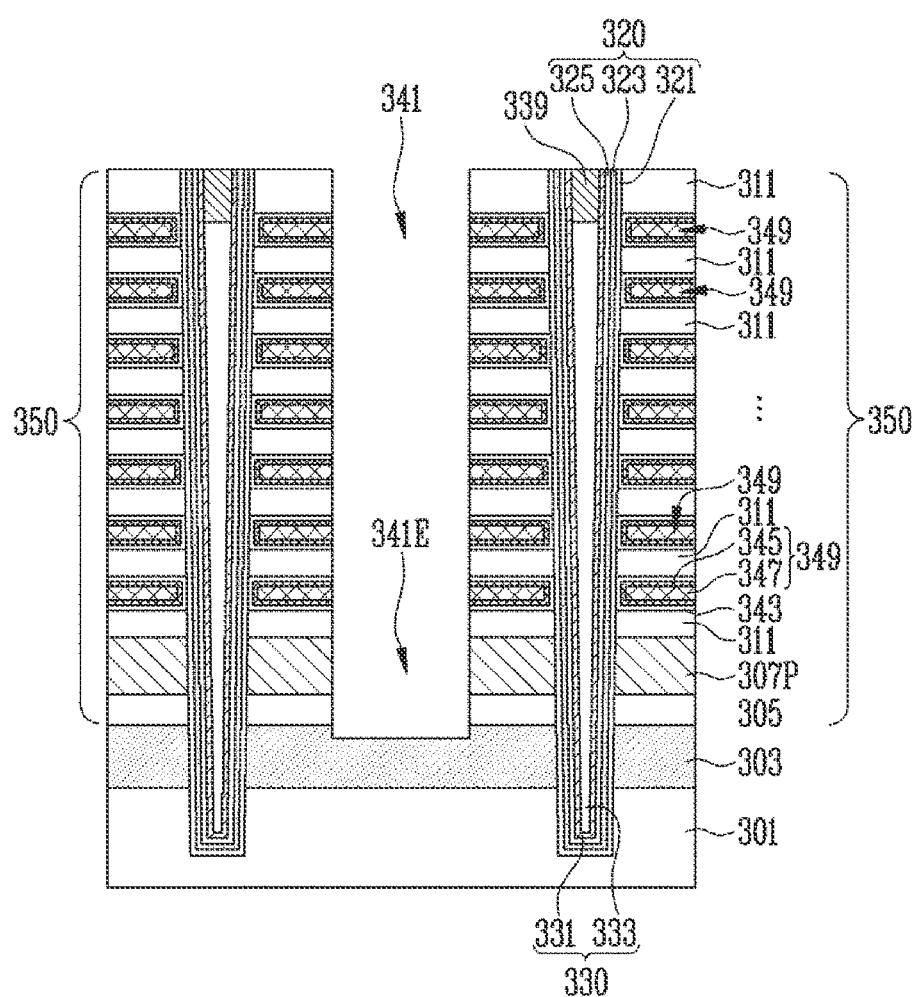
Figure 6B:
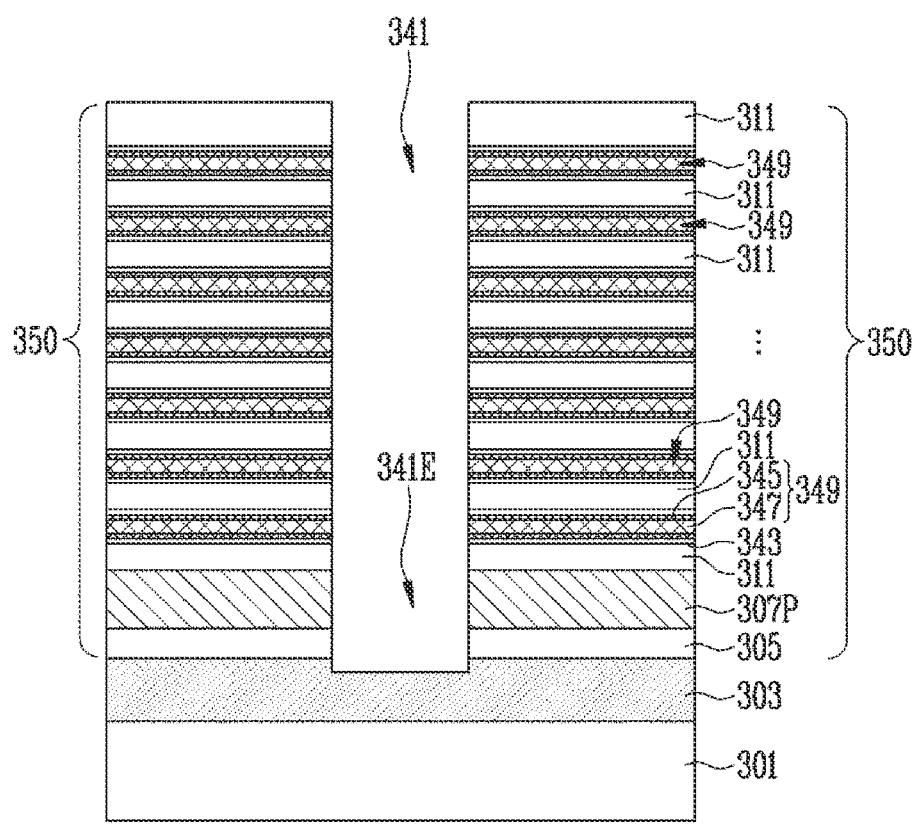

Referring to FIGS. 6A and 6B, the sacrificial layers 313 may be selectively removed through the slit 341. Accordingly, horizontal spaces between the second interlayer insulating layers 311 may be opened.

Subsequently, a second blocking insulating layer 343 may be formed along a surface of each of the horizontal spaces. The second blocking insulating layer 343 may include an insulating layer having a dielectric constant higher than that of the first blocking insulating layer 321. In an embodiment, the second blocking insulating layer 343 may include a metal oxide layer such as an aluminum oxide layer or a hafnium oxide layer, but is not limited thereto.

Subsequently, the horizontal spaces may be respectively filled with first conductive patterns 349. In an embodiment, the process of forming the first conductive patterns 349 may include a process of forming a conductive metal barrier layer 345 along the surface of each of the horizontal spaces through the slit 341, a process of forming a metal layer 347 on the conductive metal barrier layer 345, and a process of removing the conductive metal barrier layer 345 and the metal layer 347 in the slit 341. The conductive metal barrier layer 345 may be formed on the second blocking insulating layer 343.

Subsequently, the conductive layer 307 and the first interlayer insulating layer 305, which are shown in FIGS. 5A and 5B, may be etched through the slit 341. Accordingly, a slit extension part 341E may be formed. The slit extension part 341E may extend from the slit 341 and may expose the etch stop layer 303. The conductive layer 307 shown in FIGS. 5A and 5B may be isolated into first conductive patterns 307P by the slit extension part 341E.

Through the processes described with reference to FIGS. 5A and 5B and 6A and 6B, a memory structure may be defined, which includes a gate stack structure 350 including the first and second interlayer insulating layers 305 and 311 and the first and second conductive patterns 349 and 307P, the channel layer 331 which penetrates the gate stack structure 350 and the etch stop layer 303 and extends to the inside of the substrate 301, and the memory layer 320 extending along a surface of the channel layer 331, which faces the second substrate 301, and a sidewall of the channel layer 331. The process of forming the memory structure is not limited to the embodiment described above with reference to FIGS. 5A and 5B and 6A and 6B. Although not shown in the drawings, in another embodiment, the process of forming the memory structure may include, for example, a process of forming interlayer insulating layers and conductive patterns, which are alternately stacked on the etch stop layer 303, a process of forming channel holes penetrating the interlayer insulating layers and the conductive patterns, a process of forming a memory layer and a channel layer in each of the channel holes, and a process of forming a slit isolating the interlayer insulating layers and the conductive patterns into gate stack structures.

FIGS. 7A and 7B and 8A and 8B are sectional views illustrating a process of forming a bit line contact and a source contact in accordance with an embodiment of the present disclosure.

Figure 7A:
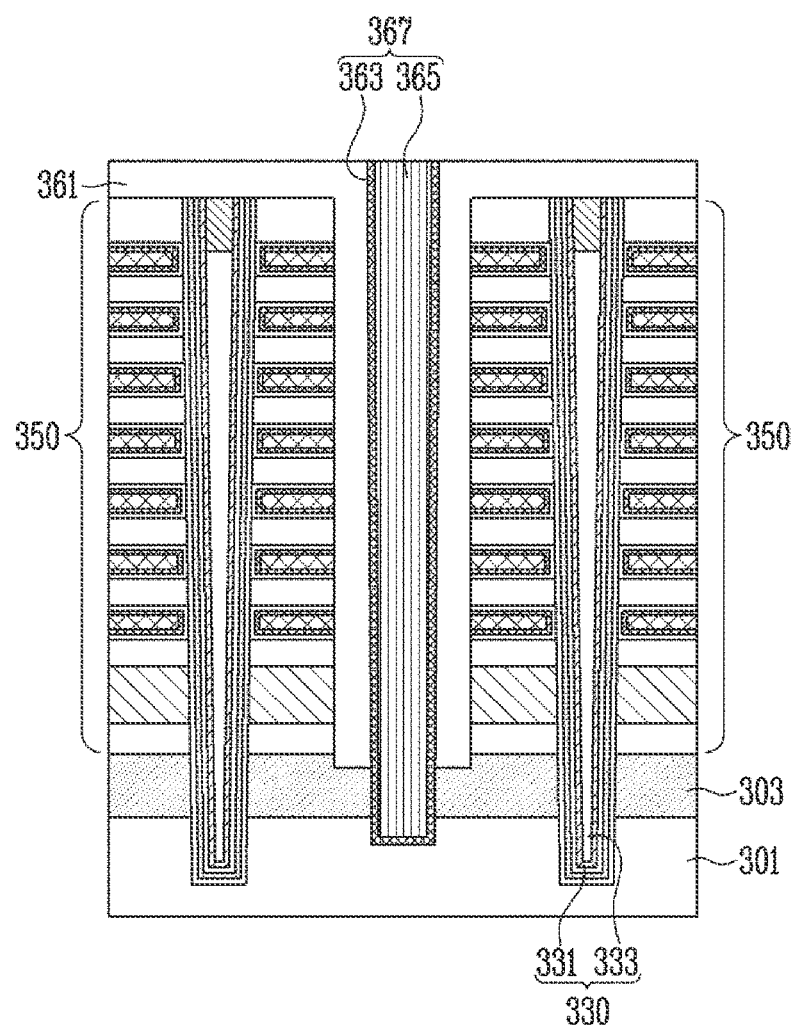
Figure 7B:
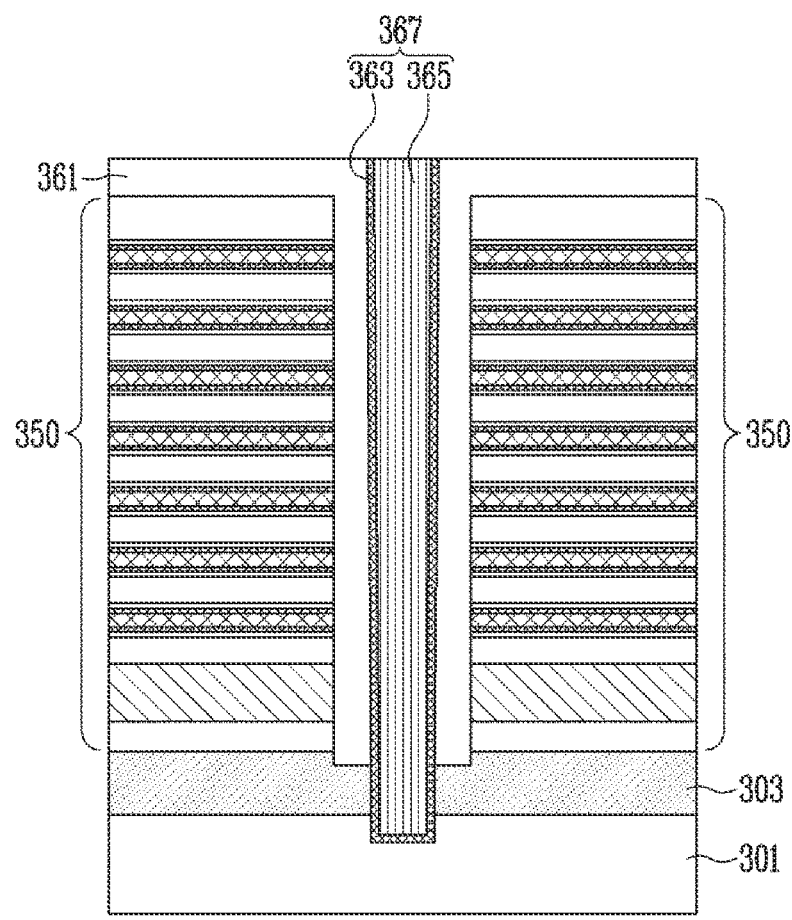

Referring to FIGS. 7A and 7B, the slit 341 and the slit extension part 341E, which are shown in FIGS. 6A and 6B, may be filled with a second insulating layer 361. The second insulating layer 361 may extend to cover the gate stack structure 350.

Subsequently, a first source contact 367 may be formed, which penetrates the second insulating layer 361 and the etch stop layer 303. The first source contact 367 may be insulated from the gate stack structure 350 by the second insulating layer 361.

As illustrated in FIGS. 7A and 7B, in an embodiment, the process of forming the first source contact 367 may include a process of etching the second insulating layer 361 and the etch stop layer 303 such that a trench exposing the second substrate 301 is defined, a process of forming a conductive metal barrier layer 363 along sidewalls of the second insulating layer 361 and the etch stop layer 303, which are exposed through the trench, and a surface of the second substrate 301, a process of forming a metal layer 365 filling the trench on the conductive metal barrier layer 363, and a process of planarizing surfaces of the conductive metal barrier layer 363 and the metal layer 365 such that the second insulating layer 361 is exposed.

Figure 8A:
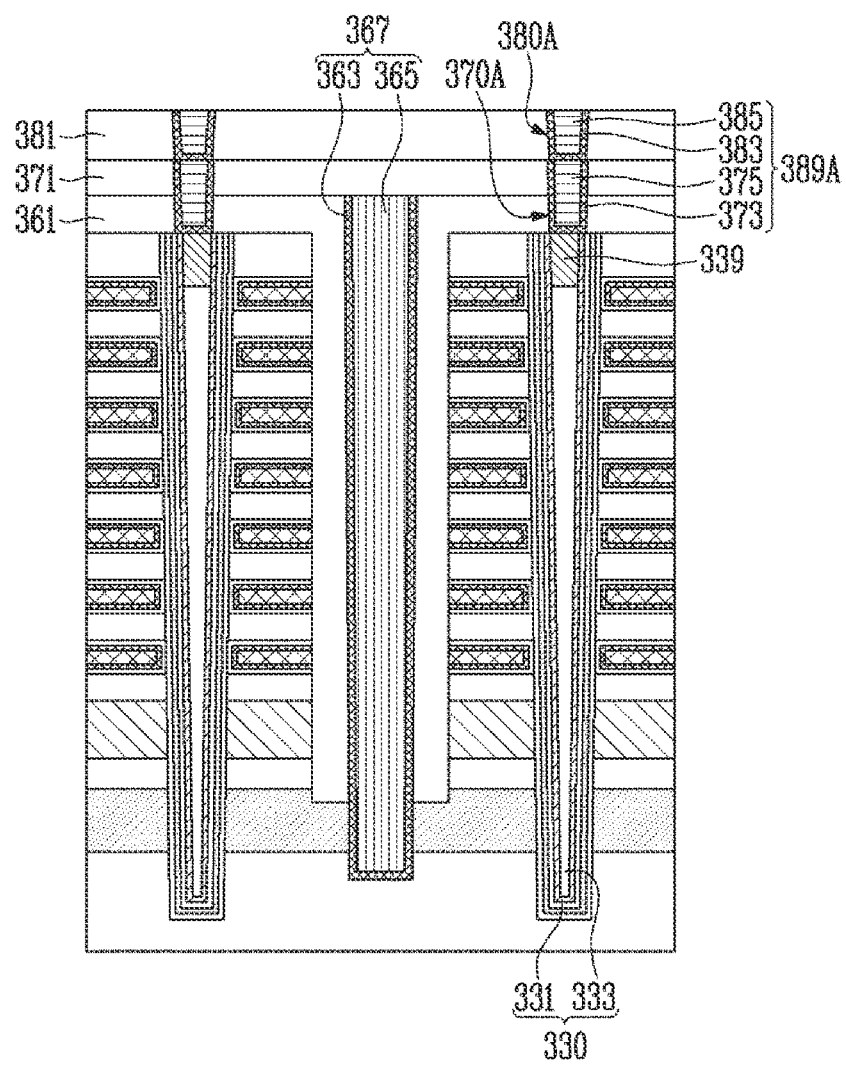
Figure 8B:
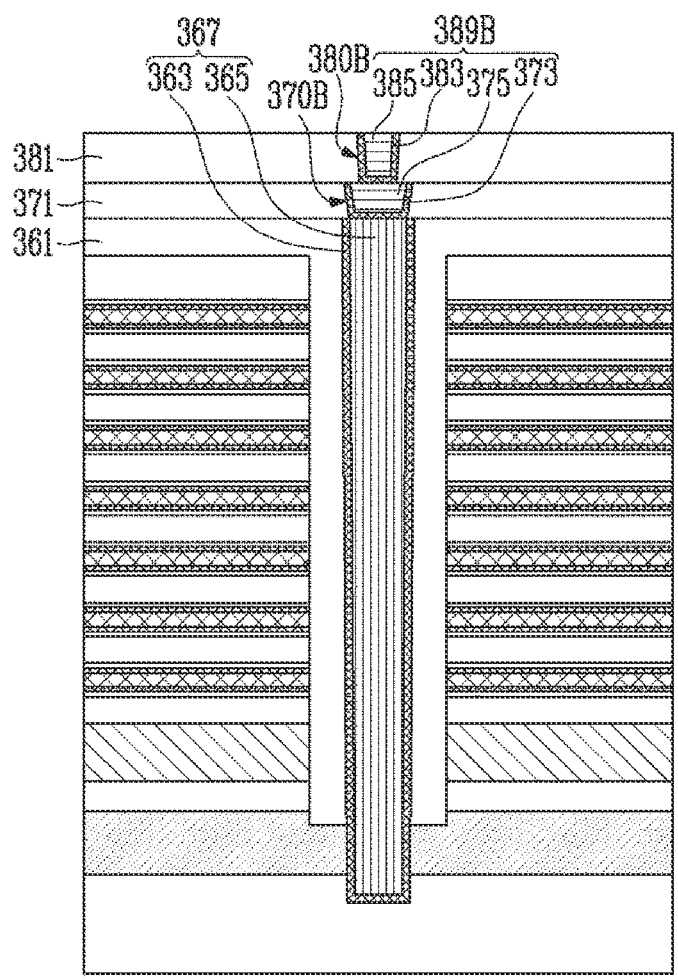

Referring to FIGS. 8A and 8B, at least one insulating layer covering the first source contact 367 and contacts 389A and 389B penetrating the at least one insulating layer may be formed. The contacts 389A and 389B may include bit line contacts 389A respectively overlapping with the channel structures 330 and a second source contact 389B overlapping with the first source contact 367.

Each of the bit line contacts 389 may extend to penetrate the second insulating layer 361, and may be connected to the capping pattern 330 and the channel layer 331. The second source contact 389B may be connected to the first source contact 367.

As illustrated in FIGS. 8A and 8B, in an embodiment, the process of forming the bit line contacts 389A and the source contact 389B may include a process of forming a third insulating layer 371 covering the first source contact 367 and the second insulating layer 361, a process of forming first openings 370A and 370B which penetrate at least one of the third insulating layer 371 and the second insulating layer 361 and respectively overlap with the channel structures 330 and the first source contact 367, a process of forming a conductive metal barrier layer 373 and a metal layer 375 in each of the first openings 370A and 370B, a process of planarizing the conductive metal barrier layer 373 and the metal layer 375 such that the third insulating layer 371 is exposed, a process of forming a fourth insulating layer 381 on the third insulating layer 371, a process of forming second openings 380A and 380B, which penetrate the fourth insulating layer 381 and respectively overlap with the channel structures 330 and the first source contact 367, a process of forming a conductive metal barrier layer 383 and a metal layer 385 in each of the second openings 380A and 380B, and a process of planarizing the conductive metal barrier layer 383 and the metal layer 385 such that the fourth insulating layer 381 is exposed.

Figure 9A:
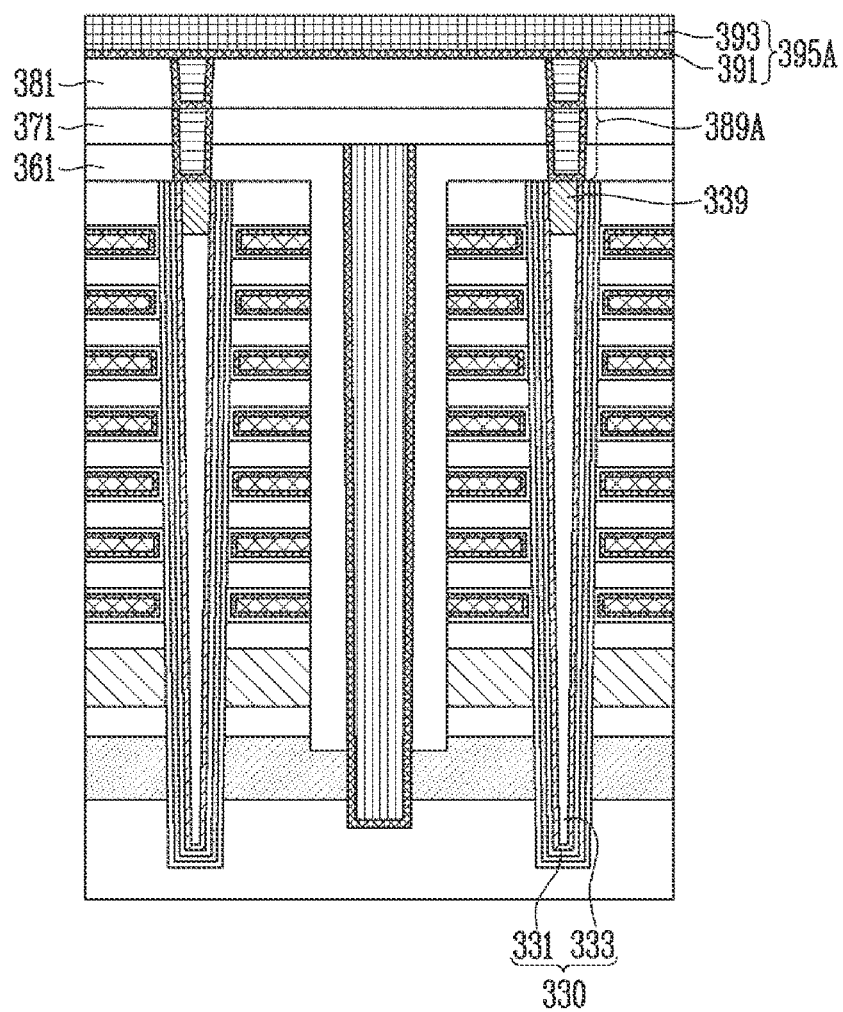
Figure 9B:
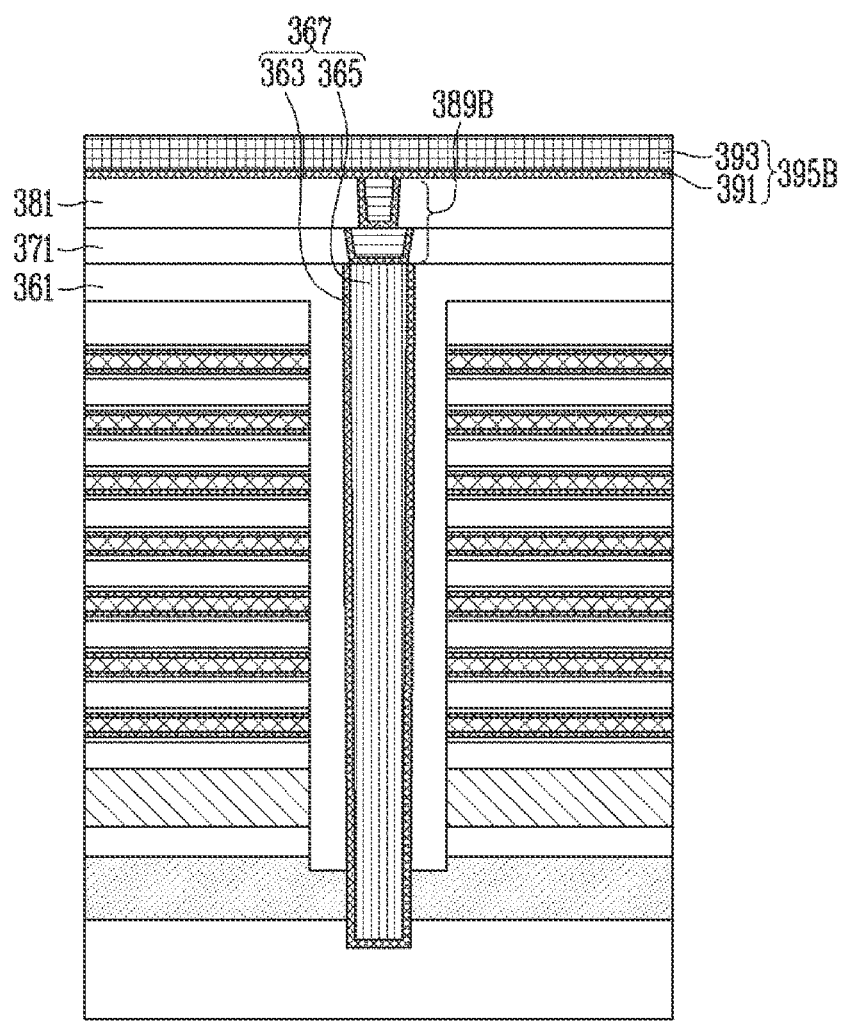

FIGS. 9A and 9B are sectional views illustrating a process of forming second conductive lines in accordance with an embodiment of the present disclosure.

Referring to FIGS. 9A and 9B, second conductive lines 395A and 395B spaced apart from each other may be formed on the fourth insulating layer 381. The second conductive lines 395A and 395B may include a bit line 395A in contact with the bit line contact 389A and a common source line 395B in contact with the second source contact 389B.

For example, in an embodiment, each of the bit line 395A and the common source line 395B may include a conductive metal barrier layer 391 and a metal layer 393 on the conductive metal barrier layer 391.

Figure 10A:
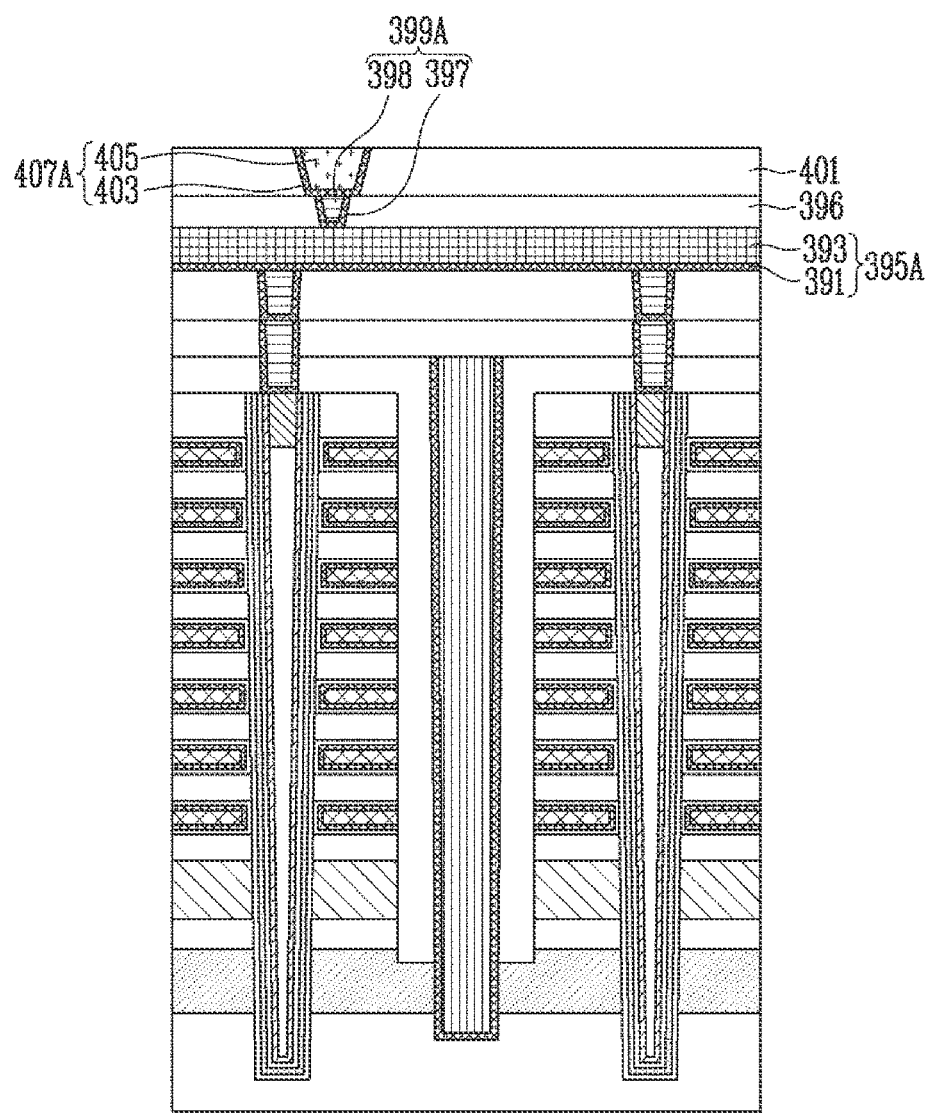
Figure 10B:
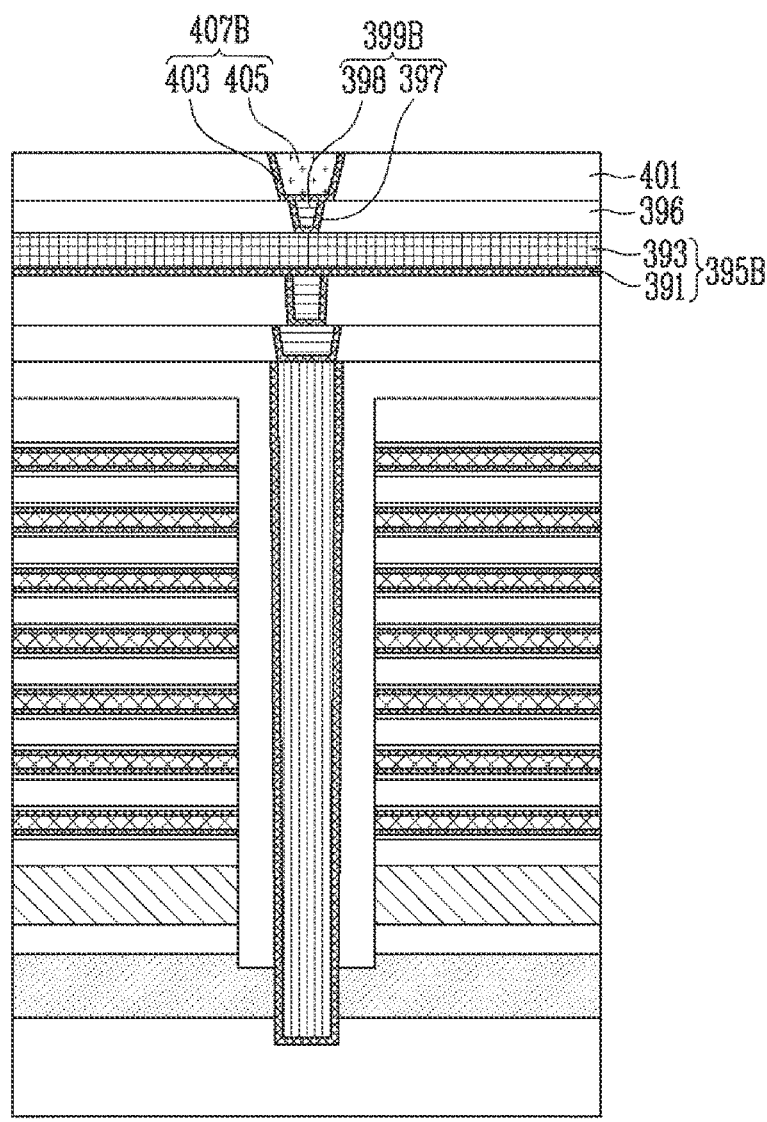

FIGS. 10A and 10B are sectional views illustrating an embodiment of subsequent processes continued after the second conductive lines are formed.

Referring to FIGS. 10A and 10B, a fifth insulating layer 396 may be formed, which covers the bit line 395A and the common source line 395B. Subsequently, pad contacts 399A and 399B may be formed, which penetrate the fifth insulating layer 396, and may include a first pad contact 399A connected to the bit line 395A and a second pad contact 399B connected to the common source line 395B. Each of the first pad contact 399A and the second pad contact 399B may include a conductive metal barrier layer 397 and a metal layer 398.

Subsequently, a second bonding insulating layer 401 may be formed to cover the first pad contact 399A and the second pad contact 399B. The second bonding insulating layer 401 may extend onto the fifth insulating layer 396.

Subsequently, conductive bonding pads 407A and 407B may be formed, which penetrate the second bonding insulating layer 401. The conductive bonding pads 407A and 407B may include a first conductive bonding pad 407A in contact with the first pad contact 399A and a second conductive bonding pad 407B in contact with the second pad contact 399B. Each of the first conductive bonding pad 407A and the second conductive bonding pad 407B may include a conductive metal barrier layer 403 and a metal layer 405 which may include copper.

Figure 11A:
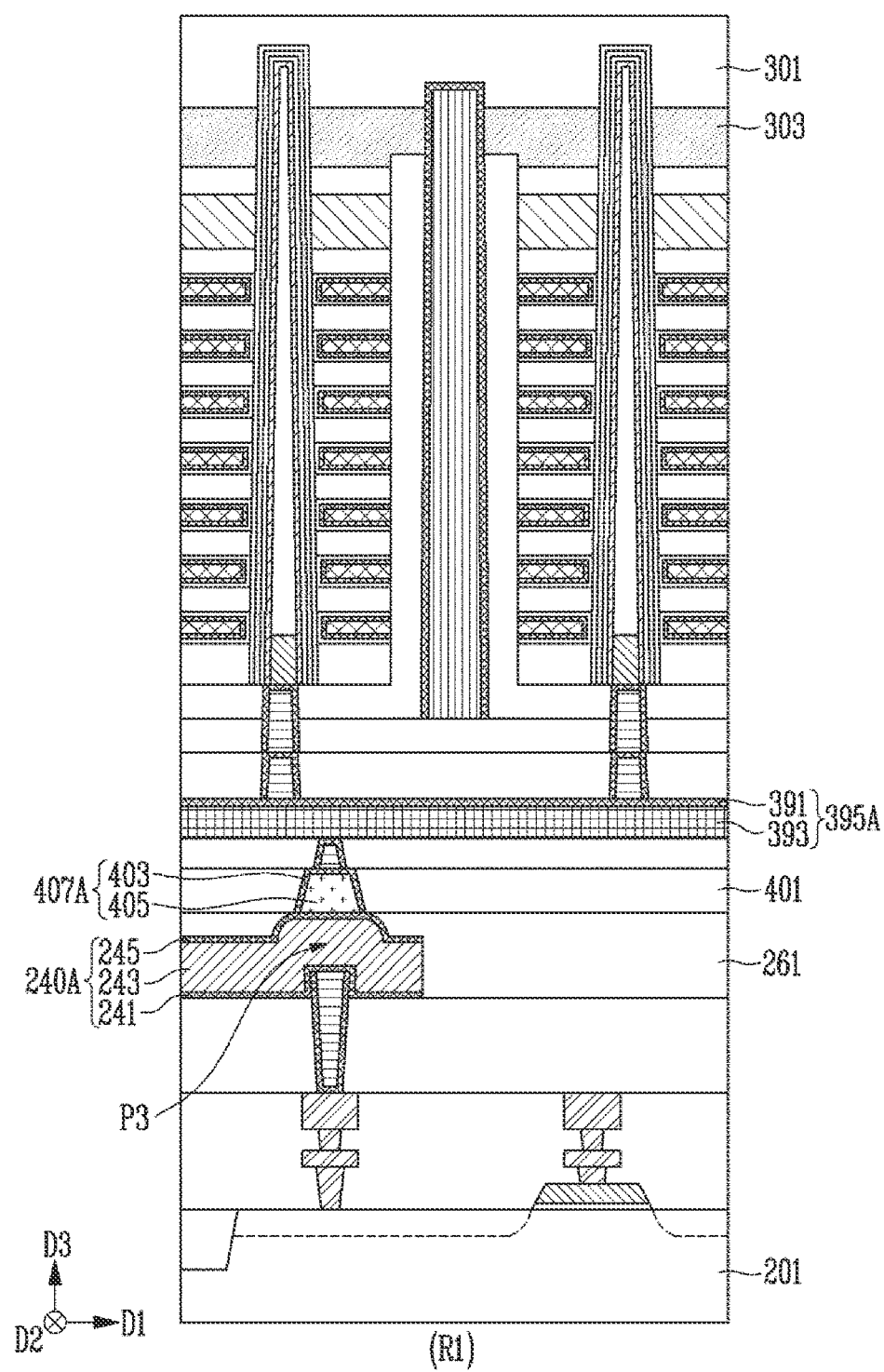
FIGS. 11A and 11B are sectional views illustrating a bonding process of the first semiconductor structure and the second semiconductor structure in accordance with an embodiment of the present disclosure.
Figure 11B:
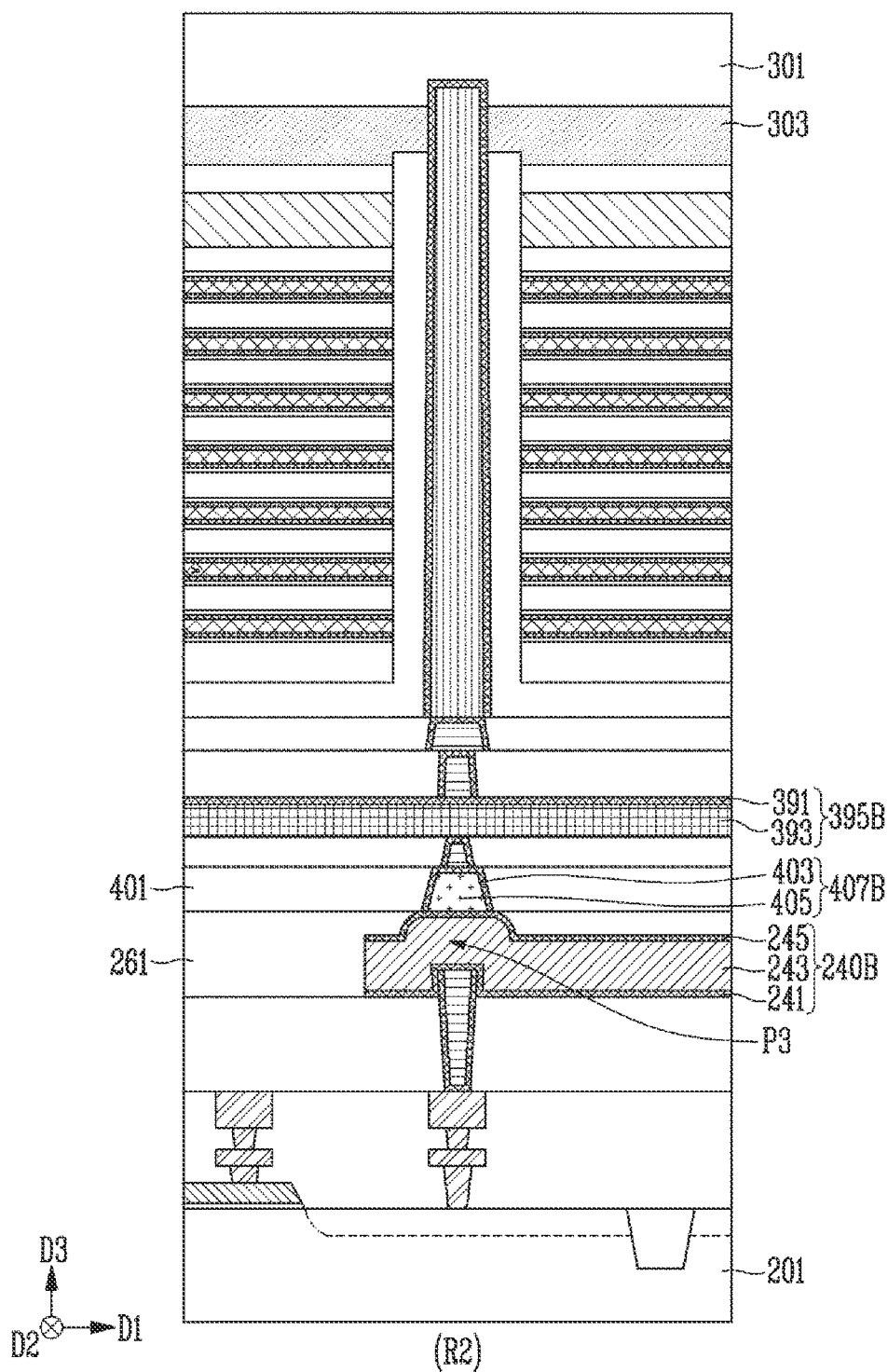

FIGS. 11A and 11B are sectional views illustrating a bonding process of the first semiconductor structure and the second semiconductor structure in accordance with an embodiment of the present disclosure. The first semiconductor structure may be provided through the continuous processes described with reference to FIGS. 4A to 4G. The second semiconductor structure may be provided through the continuous processes described with reference to FIGS. 5A, 5B, 6A, 6B, 7A, 7B, 8A, 8B, 9A, 9B, 10A, and 10B. FIG. 11A illustrates a section of the first region of the first semiconductor structure and the second semiconductor structure overlapping with the first region of the first semiconductor structure, and FIG. 11B illustrates a section of the second region R2 of the first semiconductor structure and the second semiconductor structure overlapping with the second region of the first semiconductor structure.

Referring to FIGS. 11A and 11B, the second bonding insulating layer 401 of the second semiconductor structure may be bonded to the first bonding insulating layer 261 of the first semiconductor structure, and the first conductive bonding pad 407A and the second conductive bonding pad 407B of the second semiconductor structure may be respectively bonded to the bending parts P3 of the first conductive lines 240A and 240B of the first semiconductor structure. For example, in an embodiment, the metal layer 405 of each of the first conductive bonding pad 407A and the second conductive bonding pad 407B may be bonded to the second conductive metal barrier layer 245 of each of the first conductive line 240A and 240B.

Figure 12A:
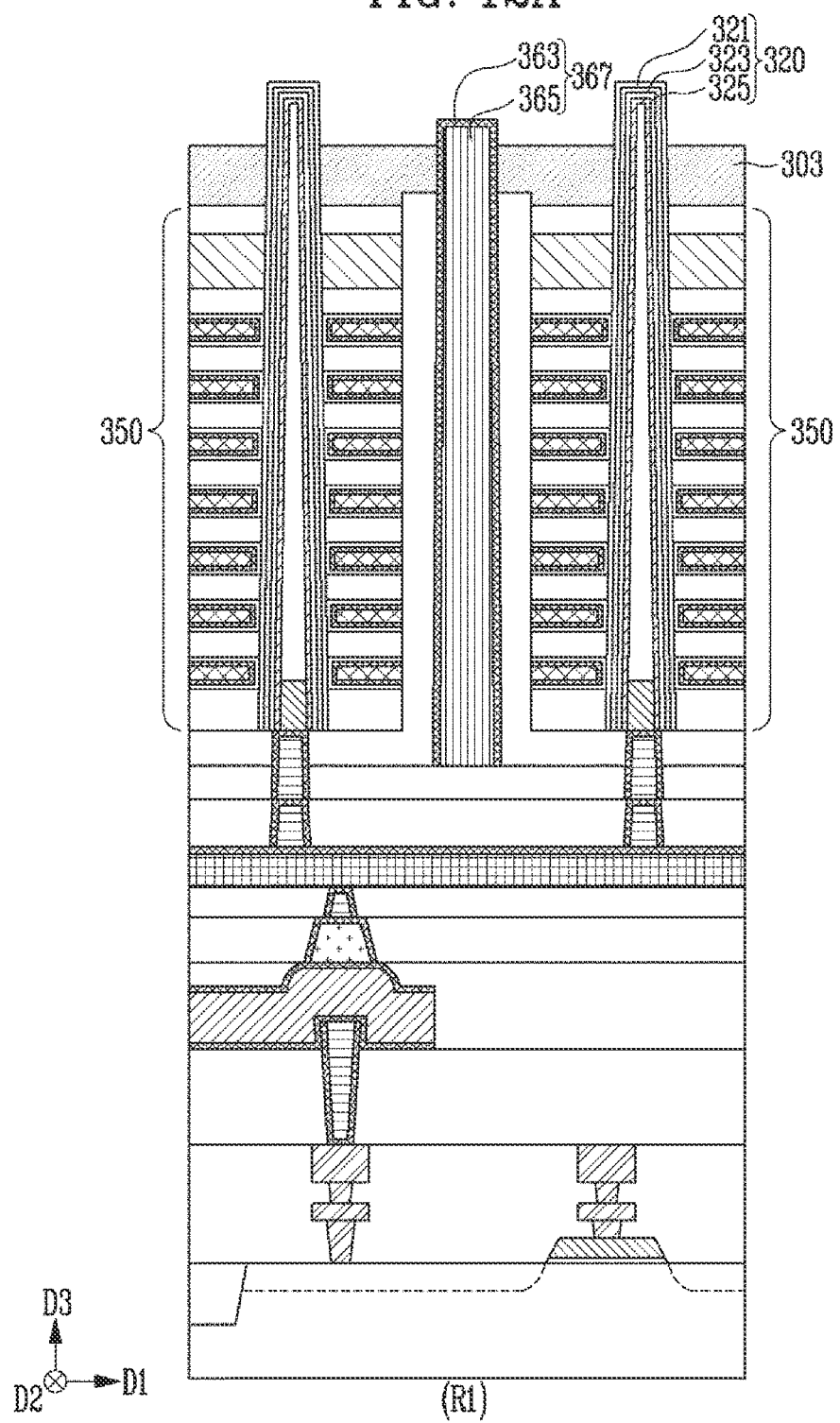
Figure 12B:
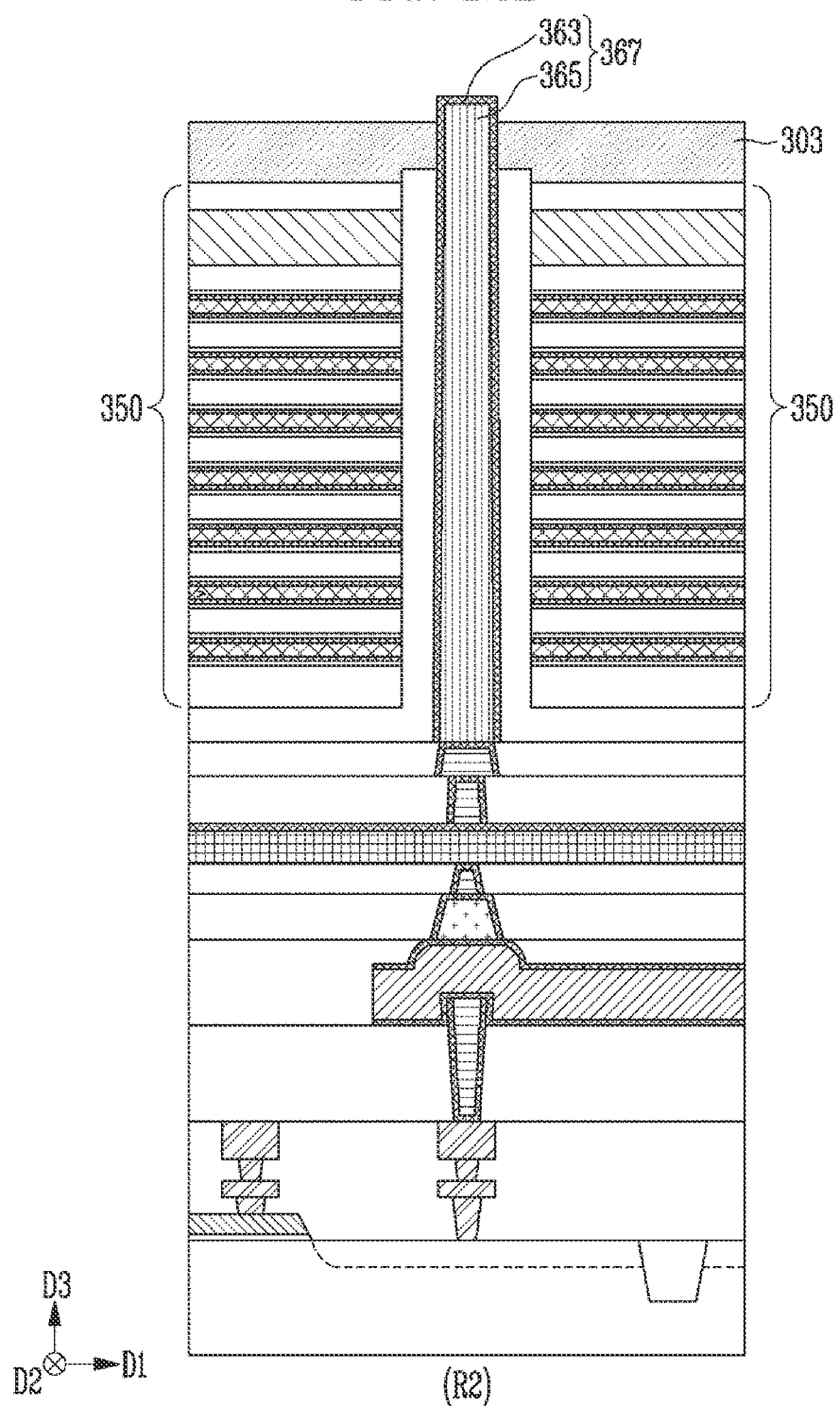
Figure 14A:
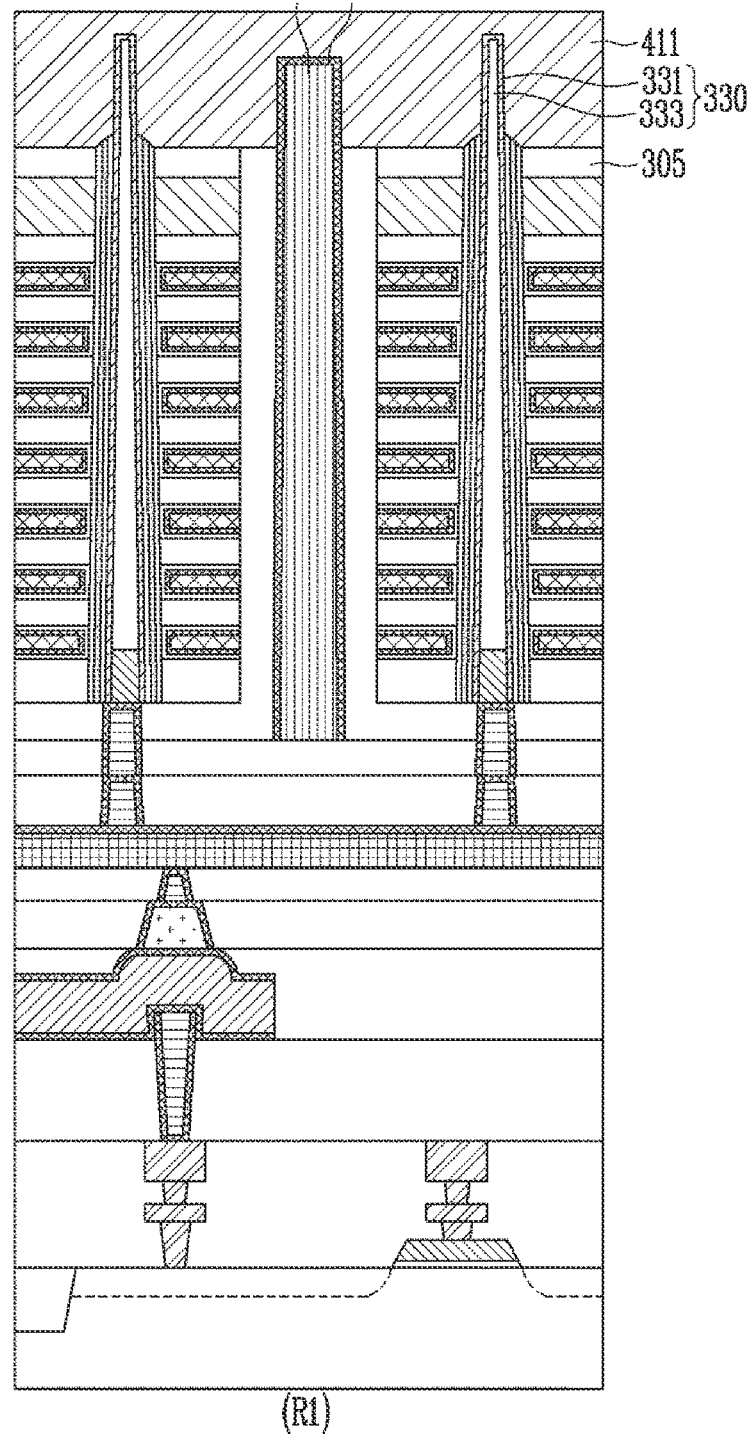
Figure 14B:
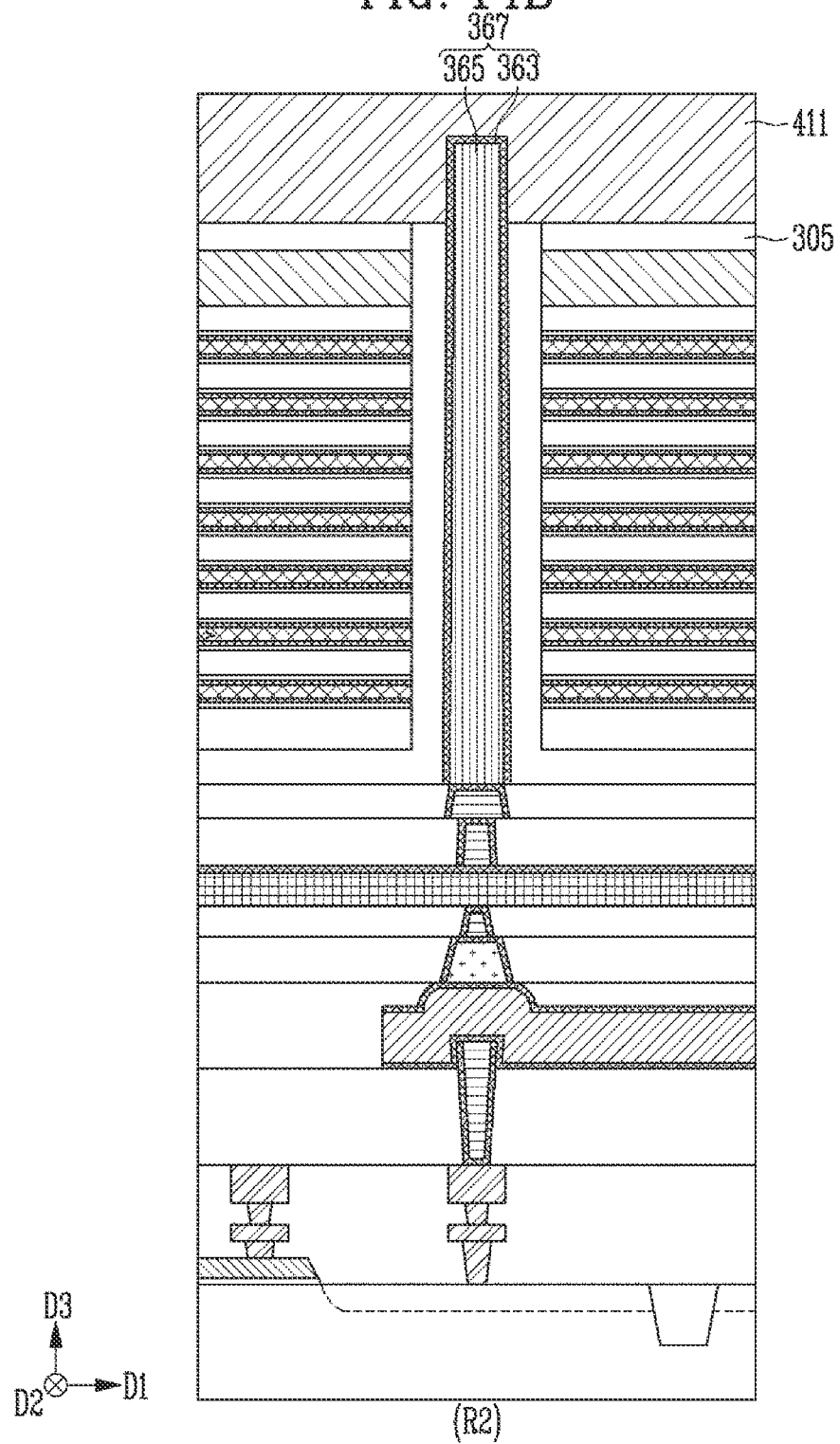

FIGS. 12A, 12B, 13A, 13B, 14A, and 14B are sectional views illustrating an embodiment of subsequent processes continued after the bonding process. FIGS. 12A, 13A, and 14A are process sectional views illustrating a section of the first region R1 of the first semiconductor structure and the second semiconductor structure overlapping with the first region R1 of the first semiconductor structure, and FIGS. 12B, 13B, and 14B are process sectional views illustrating a section of the second region R2 of the first semiconductor structure and the second semiconductor structure overlapping with the second region R2 of the first semiconductor structure.

Referring to FIGS. 12A and 12B, the second substrate 301 shown in FIGS. 11A and 11B may be selectively removed such that the etch stop layer 303, the first blocking insulating layer 321 of the memory layer 320, and the first source contact 367 may be exposed.

Referring to FIGS. 13A and 13B, partial regions of the etch stop layer 303 and the memory layer 320, which are shown in FIGS. 12A and 12B, may be removed, wherein partial regions of the first interlayer insulating layer 305 and the channel layer 331 may be exposed.

In an embodiment, the exposed region of the first blocking insulating layer 321 shown in FIG. 12A may be removed through an etch-back process, thereby exposing the data storage layer 323. A partial region of the data storage layer 323, which protrudes farther in the third direction D3 than the etch stop layer 303 shown in FIG. 12A, may be exposed. Subsequently, the exposed partial region of the data storage layer 323 and the etch stop layer 303 configured as a silicon nitride layer may be removed. Accordingly, a partial region of the tunnel insulating layer 325, which protrudes farther in the third direction D3 than the gate stack structure 350 shown in FIG. 12A, may be exposed. Subsequently, the exposed partial region of the tunnel insulating layer 325 may be removed. A partial region of the first blocking insulating layer 321, which protrudes farther in the third direction D3 than the gate stack structure 350 shown in FIG. 12A, may be removed.

Referring to FIGS. 14A and 14B, a source layer 411 may be formed to be in contact with the exposed region of the channel layer 331 and the exposed region of the first source contact 367. The source layer 411 may include a doped semiconductor layer. The source layer 411 may include at least one of an n-type impurity and a p-type impurity. In an embodiment, the source layer 411 may include a doped silicon layer doped with an n-type impurity.

Figure 15:
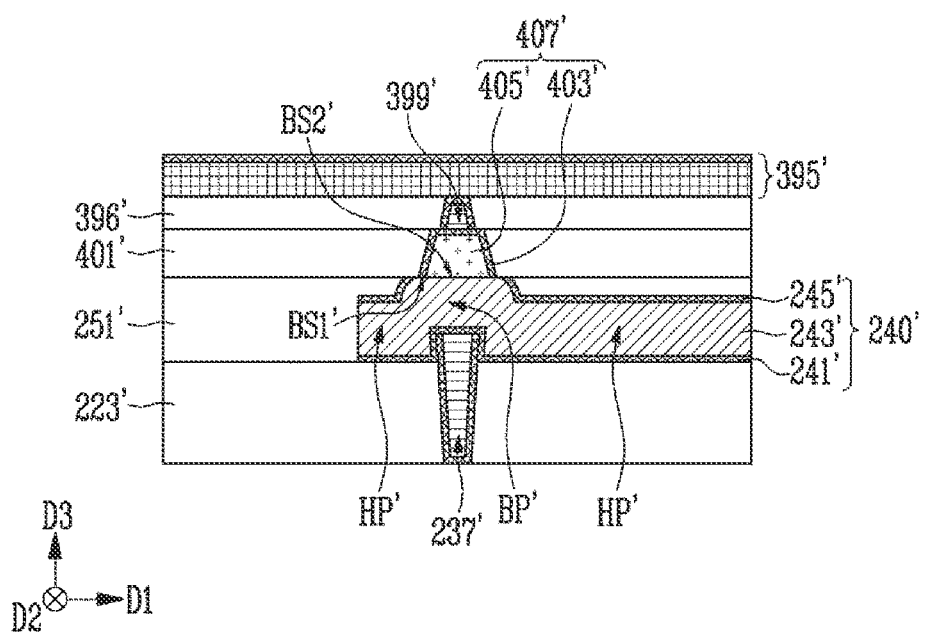
FIG. 15 is a sectional view illustrating a bonding structure in accordance with an embodiment of the present disclosure.

FIG. 15 is a sectional view illustrating a bonding structure in accordance with an embodiment of the present disclosure. The components disposed between the first circuit structure C1 and the second circuit structure C2, which are shown in FIGS. 3A and 3B, may be replaced with components shown in FIG. 15.

Referring to FIG. 15, the bonding structure may include a first bonding structure configured with a first bonding insulating layer 251' and a second bonding insulating layer 401', which are bonded to each other, and a second bonding structure configured with a first conductive line 240' and a conductive bonding pad 407', which are bonded to each other.

The first conductive line 240' may overlap with a first insulating layer 233' and a contact structure 237' penetrating the first insulating layer 233' as described with reference to FIGS. 3A and 3B.

The contact structure 237' may protrude farther in the third direction D3 than the first insulating layer 233' as described with reference to FIGS. 3A and 3B. The first conductive line 240' may include a horizontal part HP' on the first insulating layer 233' and a bending part BP' which extends from the horizontal part HP' and surrounding a protrusion part of the contact structure 237, as described with reference to FIGS. 3A and 3B.

As illustrated in FIG. 15, the first conductive line 240' may include a first conductive metal barrier layer 241' and a metal layer 243' on the first conductive metal barrier layer 241, and a second conductive metal barrier layer 245' on the metal layer 243'. The metal layer 243' may penetrate the second conductive metal barrier layer 245, and may be bonded to the conductive boding pad 407'. In order to provide this structure, after the processes described with reference to FIGS. 4A to 4G are performed, the second conductive metal barrier layer 245' may be planarized such that the metal layer 243' overlapping with the contact structure 237' is exposed.

For example, the conductive bonding pad 407' may include a conductive metal barrier layer 405' and a metal layer 403' as described with reference to FIGS. 3A and 3B. The metal layer 403' of the conductive bonding pad 407' may be bonded to the metal layer 243' of the first conductive line 240'.

In an embodiment, the metal layer 243' of the first conductive line 240' may include aluminum, and the metal layer 403' of the conductive bonding pad 407' may include copper. Accordingly, the second bonding structure between the conductive bonding pad 407' and the bending part BP' of the first conductive line 204' may be configured as a bonding structure between the copper and the aluminum.

The metal layer 243' of the first conductive line 240' may have a first bonding surface BS1' facing the conductive bonding pad 407', and the metal layer 403' of the conductive bonding pad 407' may have a second bonding surface BS2' facing the first conductive line 240'. The first bonding surface BS1' may be formed wider than the second bonding surface BS2'. When the first bonding surface BS1' is formed wider than the second bonding surface BS2', a portion of the first bonding surface BS1' may be in contact with the second bonding insulating layer 401'. The second bonding insulating layer 401' may be formed of a silicon nitride layer doped with carbon, so that diffusion of metal from the metal layer 243' of the first conductive line 240' may be mitigated or prevented through the second bonding insulating layer 401'.

As illustrated in FIG. 15, the conductive bonding pad 407' may penetrate the second bonding insulating layer 401', and be in contact with a pad contact 399'. The pad contact 399' may penetrate an insulating layer 396' between a second conductive line 395' and the second bonding insulating layer 401', and may electrically connect the conductive bonding pad 407' and the second conductive line 395' to each other.

FIGS. 16A and 16B are sectional views schematically illustrating bonding structures between first and second semiconductor structures in accordance with embodiments of the present disclosure.

Referring to FIG. 16A, a first semiconductor structure S1A may include a first circuit structure 510, a first contact structure 525 connected to the first circuit structure 510, a first conductive line 530 connected to the first circuit structure 510 via the first contact structure 525, a pad contact 545 connected to the first conductive line 530, and a conductive bonding pad 555 connected to the first conductive line 530 via the pad contact 545.

As illustrated in FIGS. 16A and 16B, the second semiconductor structure S2A may include a second circuit structure 560, a second contact structure 575 connected to the second circuit structure 560, and a second conductive line 580 connected to the second circuit structure 560 via the second contact structure 575.

The first semiconductor structure S1A and the second semiconductor structure S2A may be bonded to each other through a first bonding structure configured with a first bonding insulating layer 550 and a second bonding insulating layer 590, which are bonded to each other, and a second bonding structure configured with the conductive bonding pad 555 and the second conductive line 580, which are bonded to each other.

The first circuit structure 510 of the first semiconductor structure S1A may overlap with the second circuit structure 560 of the second semiconductor structure 560. The first contact structure 523, the first conductive line 530, the pad contact 545, and the conductive bonding pad 555 of the first semiconductor structure S1A may be disposed between the first circuit structure 510 and the second circuit structure 560. The second contact structure 575 and the second conductive line 580 of the second semiconductor structure S2A may be disposed between the second circuit structure 560 and the first conductive line 530.

The first circuit structure 510 of the first semiconductor structure S1A and the second circuit structure 560 of the second semiconductor structure S2A may include different structures or the same structure. For example, in an embodiment, one of the first circuit structure 510 and the second circuit structure 560 may include a memory structure, and the other of the first circuit structure 510 and the second circuit structure 560 may include a peripheral circuit structure for controlling an operation of the memory structure. In another embodiment, for example, one of the first circuit structure 510 and the second circuit structure 560 may include a first memory structure, and the other of the first circuit structure 510 and the second circuit structure 560 may include a second memory structure. The peripheral circuit structure may include the transistors TR1 and TR2 and the interconnections 123, which are described with reference to FIGS. 3A and 3B. Each of the memory structure, the first memory structure, and the second memory structure may include the gate stack structures GST, the channel structures CH, and the memory layers ML, which are described with reference to FIGS. 3A and 3B.

As illustrated in FIG. 16A, the first contact structure 525 of the first semiconductor structure S1A may penetrate a first insulating layer 520 disposed between the first circuit structure 510 and the first conductive line 530, to electrically connect the first circuit structure 510 and the first conductive line 530 to each other.

The second contact structure 575 of the second semiconductor structure S2A may penetrate a second insulating layer 570 disposed between the second circuit structure 560 and the second conductive line 580, to electrically connect the second circuit structure 560 and the second conductive line 580 to each other. The second contact structure 575 may include a region protruding farther toward the first conductive line 530 than the second insulating layer 570.

The second conductive line 580 of the second semiconductor structure S2A may include a bending part protruding toward the first conductive line 530. The bending part of the second conductive line 580 may have a shape bent along a surface of the protruding region of the second contact structure 575. The bending part of the second conductive line 580 may be bonded to the conductive bonding pad 555, to constitute the second bonding structure.

The pad contact 545 of the first semiconductor structure S1A may penetrate a third insulating layer 540 between the first bonding insulating layer 550 and the first conductive line 530, to electrically connect the first conductive line 530 and the conductive bonding pad 555 to each other.

Referring to FIG. 16B, a first semiconductor structure S1B may include a first circuit structure 610, a first contact structure 625 connected to the first circuit structure 610, and a first conductive line 630 connected to the first circuit structure 610 via the first contact structure 625.

A second semiconductor structure S2B may include a second circuit structure 660, a second contact structure 675 connected to the second circuit structure 660, and a second conductive line 680 connected to the second circuit structure 660 via the second contact structure 675.

Subsequently, the first semiconductor structure S1B and the second semiconductor structure S2B may be bonded to each other through a first bonding structure configured with a first bonding insulating layer 640 and a second bonding insulating layer 690, which are bonded to each other, and a second bonding structure configured with the first conductive line 630 and the second conductive line 680, which are bonded to each other.

Accordingly, the first circuit structure 610 of the first semiconductor structure S1B may overlap with the second circuit structure 660 of the second semiconductor structure S2B. The first contact structure 625 and the first conductive line 630 of the first semiconductor structure S1B and the second contact structure 675 and the second conductive line 680 of the second semiconductor structure S2B may be disposed between the first circuit structure 610 and the second circuit structure 660.

The first circuit structure 610 of the first semiconductor structure S1B and the second circuit structure 660 of the second semiconductor structure S2B may include different structures or the same structure. For example, in an embodiment, one of the first circuit structure 610 and the second circuit structure 660 may include a memory structure, and the other of the first circuit structure 610 and the second circuit structure 660 may include a peripheral circuit structure for controlling an operation of the memory structure. Alternatively, in another embodiment, one of the first circuit structure 610 and the second circuit structure 660 may include a first memory structure, and the other of the first circuit structure 610 and the second circuit structure 660 may include a second memory structure. The peripheral circuit structure may include the transistors TR1 and TR2 and the interconnections 123, which are described with reference to FIGS. 3A and 3B. Each of the memory structure, the first memory structure, and the second memory structure may include the gate stack structures GST, the channel structures CH, and the memory layers ML, which are described with reference to FIGS. 3A and 3B.

The first contact structure 625 of the first semiconductor structure S1B may penetrate a first insulating layer 620 disposed between the first circuit structure 610 and the first conductive line 630, to electrically connect the first circuit structure 610 and the first conductive line 630 to each other. The first contact structure 625 may include a protrusion part protruding farther toward the second conductive line 680 than the first insulating layer 620. The first conductive line 630 of the first semiconductor structure S1B may include a bending part protruding toward the second conductive line 680. The bending part of the first conductive line 630 may have a shape bent along a surface of the protrusion part of the first contact structure 625.

The second contact structure 675 of the second semiconductor structure S2B may penetrate a second insulating layer 670 disposed between the second circuit structure 660 and the second conductive line 680, to electrically connect the second circuit structure 660 and the second conductive line 680 to each other. The second contact structure 675 may include a protrusion part protruding farther toward the first conductive line 630 than the second insulating layer 670. The second conductive line 680 of the second semiconductor structure S2B may include a bending part protruding toward the first conductive line 630. The bending part of the second conductive line 680 may have a shape bent along a surface of a protruding region of the second contact structure 675.

The first bonding insulating layer 640 and the second bonding insulating layer 690 may be disposed between the first conductive line 630 and the second conductive line 680. The first bonding insulating layer 640 disposed between the first conductive line 630 and the second bonding insulating layer 690 may be penetrated by the bending part of the first conductive line 630. The second bonding insulating layer 690 disposed between the second conductive layer 680 and the first bonding insulating layer 640 may be penetrated by the bending part of the second conductive line 680. The bending part of the first conductive line 630 and the bending part of the second conductive line 680 may be bonded to each other, to constitute the second bonding structure.

Figure 17:
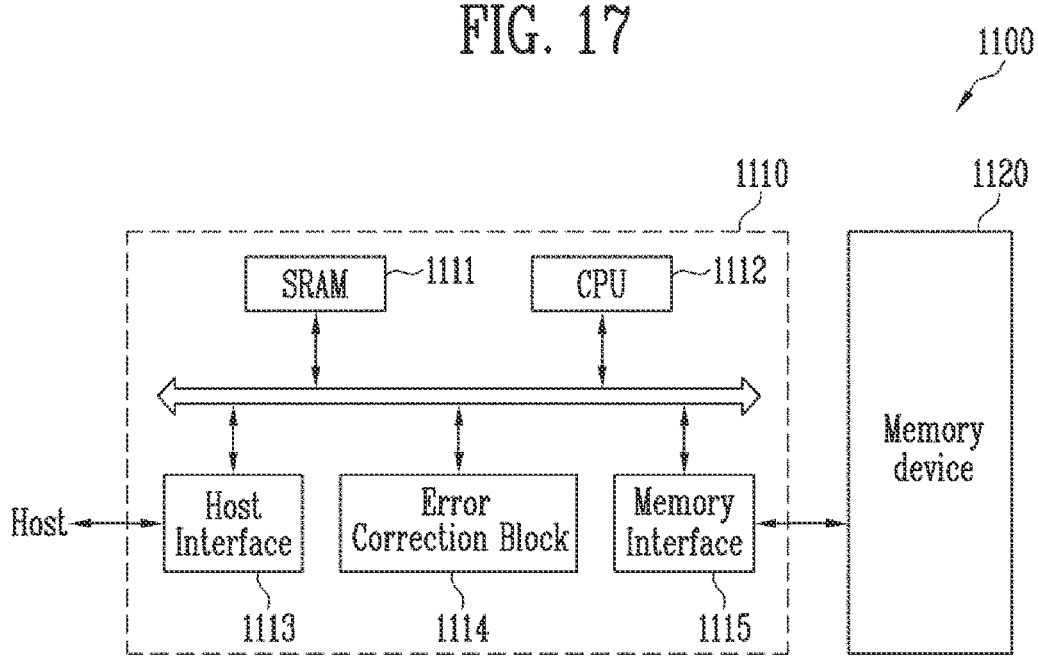
FIG. 17 is a block diagram illustrating a configuration of a memory system in accordance with an embodiment of the present disclosure.

FIG. 17 is a block diagram illustrating a configuration of a memory system in accordance with an embodiment of the present disclosure.

Referring to FIG. 17, the memory system 1100 includes a memory device 1120 and a memory controller 1110.

The memory device 1120 may be a multi-chip package configured with a plurality of flash memory chips. The memory device 1120 may include a first circuit structure and a second circuit structure, which are bonded to each other through a bonding structure. A first conductive line and a second conductive line may be interposed between the first circuit and the second circuit, wherein the first conductive line may be connected to the first circuit structure, and the second conductive line may be connected to the second circuit structure. One of the first conductive line and the second conductive line may include a bending part protruding toward the other, and the bending part may constitute the bonding structure. Each of the first circuit structure and the second circuit structure may be configured as a memory structure or a peripheral circuit structure.

The memory controller 1110 controls the memory device 1120, and may include Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Drive (SSD), in which the memory device 1120 is combined with the memory controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 18:
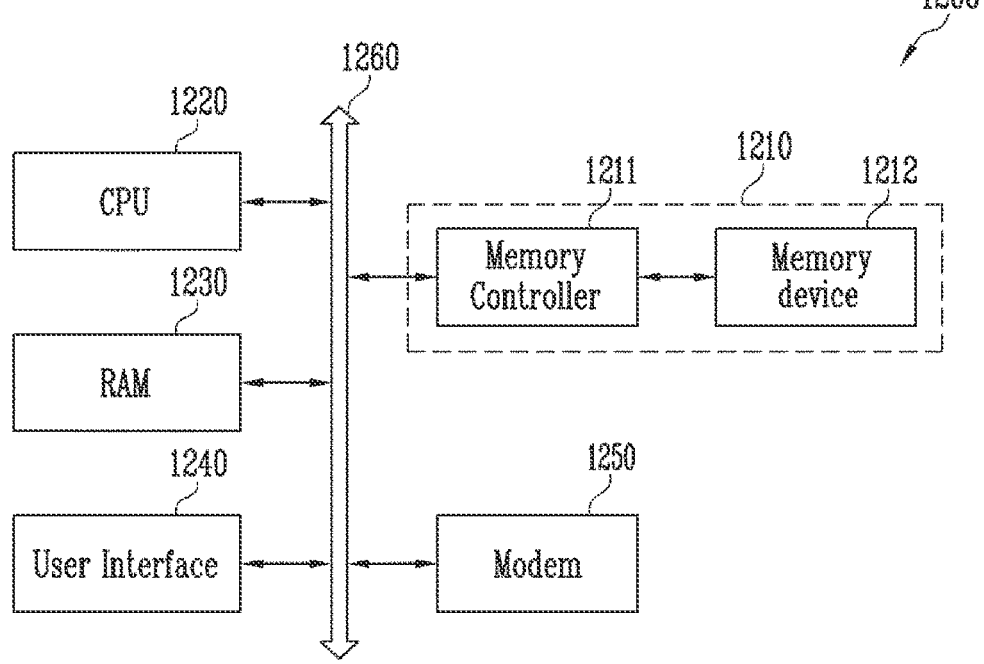
FIG. 18 is a block diagram illustrating a configuration of a computing system in accordance with an embodiment of the present disclosure.

FIG. 18 is a block diagram illustrating a configuration of a computing system in accordance with an embodiment of the present disclosure.

Referring to FIG. 18, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an Image Processor, a mobile DRAM, and the like may be further included.

The memory system 1210 may be configured with a memory device 1212 and a memory controller 1211.

The memory device 1212 may include a first circuit structure and a second circuit structure, which are bonded to each other through a bonding structure. A first conductive line and a second conductive line may be interposed between the first circuit and the second circuit such that the first conductive line may be connected to the first circuit structure, and the second conductive line may be connected to the second circuit structure. One of the first conductive line and the second conductive line may include a bending part protruding toward the other, and the bending part may constitute the bonding structure. Each of the first circuit structure and the second circuit structure may be configured as a memory structure or a peripheral circuit structure.

The memory controller 1211 may be configured in the same manner as the memory controller 1100 described with reference to FIG. 17.

In accordance with the present disclosure, individually formed circuit structures are bonded to each other, so that a phenomenon may be prevented in which a defect occurs in another circuit structure due to heat generated in a process of forming any one of the circuit structures. Accordingly, a defect of the semiconductor memory device may be reduced, and thus the operational reliability of the semiconductor memory device may be improved.

In accordance with the present disclosure, a partial region of a conductive line for transmitting a signal protrudes and is used as a bonding region, so that the conductive line may be used as a bonding member.

What is claimed is:

1. A semiconductor memory device comprising:
    an insulating layer covering a peripheral circuit structure;
    a contact structure connected to the peripheral circuit structure while penetrating the insulating layer, the contact structure including a protrusion part protruding farther than the insulating layer in a vertical direction opposite to a direction toward the peripheral circuit structure;
    a first conductive line including a bending part surrounding the protrusion part of the contact structure and a horizontal part extending onto the insulating layer from the bending part, wherein the first conductive line further includes a first conductive metal barrier layer, a metal layer formed on the first conductive metal barrier layer, and a second conductive metal barrier layer formed on the metal layer;
    a conductive bonding pad bonded to an upper surface of the bending part of the first conductive line; and
    a memory structure connected to the conductive bonding pad,
    wherein the metal layer of the first conductive line penetrates the second conductive metal barrier layer of the first conductive line, and is bonded to the conductive bonding pad.

2. The semiconductor memory device of claim 1, wherein the bending part of the first conductive line has a bent shape corresponding to the protrusion part of the contact structure.

3. The semiconductor memory device of claim 1, wherein the bending part of the first conductive line includes a first bonding surface facing the conductive bonding pad,
    wherein the conductive bonding pad includes a second bonding surface facing the first conductive line, and
    wherein the first bonding surface is formed wider than the second bonding surface.

4. The semiconductor memory device of claim 1, wherein the first conductive metal barrier layer extends along surfaces of the protrusion part of the contact structure and the insulating layer.

5. The semiconductor memory device of claim 1, wherein an upper surface of the horizontal part is flat, and the upper surface of the bending part protrudes more than the upper surface of the horizontal part.

6. The semiconductor memory device of claim 1, wherein the conductive bonding pad includes:
    a metal layer bonded to the bending part; and
    a conductive metal barrier layer surrounding a sidewall of the metal layer, the conductive metal barrier layer extending along a surface of the metal layer, which faces in the vertical direction.

7. The semiconductor memory device of claim 6, wherein the metal layer of the conductive bonding pad includes a bonding surface facing the bending part of the first conductive line.

8. The semiconductor memory device of claim 1, further comprising:
    a first bonding insulating layer disposed between the memory structure and the first conductive line, the first bonding insulating layer being penetrated by the bending part of the first conductive line; and
    a second bonding insulating layer disposed between the first bonding insulating layer and the memory structure, the second bonding insulating layer being penetrated by the conductive bonding pad, the second bonding insulating layer being bonded to the first bonding insulating layer.

9. The semiconductor memory device of claim 8, wherein at least one of the first bonding insulating layer and the second bonding insulating layer includes a silicon nitride layer doped with carbon.

10. The semiconductor memory device of claim 1, further comprising:
    a second conductive line connected to the conductive bonding pad, the second conductive line being disposed between the conductive bonding pad and the memory structure; and
    a source layer overlapping with the second conductive line with the memory structure interposed therebetween.

11. The semiconductor memory device of claim 10, wherein the memory structure includes:
    a gate stack structure disposed between the source layer and the second conductive line, the gate stack structure including interlayer insulating layers and conductive patterns, which are alternately stacked in the vertical direction;
    a channel layer in contact with the source layer, the channel layer penetrating the gate stack structure; and
    a memory layer disposed between the channel layer and the gate stack structure.

12. The semiconductor memory device of claim 11, further comprising a bit line contact disposed between the channel layer and the second conductive line, the bit line contact electrically connecting the channel layer and the second conductive line to each other,
    wherein the peripheral circuit structure includes a transistor constituting a page buffer, and
    wherein the first conductive line is connected to the transistor via the contact structure.

13. The semiconductor memory device of claim 11, further comprising a source contact spaced apart from the gate stack structure, the source contact being disposed between the source layer and the second conductive line, the source contact electrically connecting the source layer and the second conductive line to each other,
    wherein the peripheral circuit structure includes a transistor constituting a source line driver, and
    wherein the first conductive line is connected to the transistor via the contact structure.

* * * * *